United States Patent [19]
Kobayashi

[11] Patent Number: 5,495,823
[45] Date of Patent: Mar. 5, 1996

[54] THIN FILM MANUFACTURING METHOD

[75] Inventor: Kiyoteru Kobayashi, Hyogo, Japan

[73] Assignee: Mitsubishi Denki Kabushiki Kaisha, Tokyo, Japan

[21] Appl. No.: 274,932

[22] Filed: Jul. 14, 1994

Related U.S. Application Data

[62] Division of Ser. No. 16,441, Feb. 11, 1993, abandoned.

[30] Foreign Application Priority Data

Mar. 23, 1992 [JP] Japan .................................. 4-064829
Jan. 18, 1993 [JP] Japan .................................. 5-006059

[51] Int. Cl.$^6$ .................................................. H01L 21/20
[52] U.S. Cl. .......................... 117/8; 117/95; 117/930; 117/935
[58] Field of Search ............................. 117/95, 8, 930, 117/935

[56] References Cited

U.S. PATENT DOCUMENTS 5,147,826  9/1992  Lui et al. ................................. 117/930

FOREIGN PATENT DOCUMENTS

| | | |
|---|---|---|
| 114214 | 5/1987 | Japan .................................. 117/930 |
| 293611 | 11/1989 | Japan .................................. 117/95 |
| 2-84772 | 3/1990 | Japan . |
| 2-100315 | 4/1990 | Japan . |
| 2-132819 | 5/1990 | Japan . |
| 175690 | 7/1990 | Japan .................................. 117/95 |
| 2-224323 | 9/1990 | Japan . |
| 284416 | 11/1990 | Japan .................................. 117/930 |
| 3-96225 | 4/1991 | Japan . |

OTHER PUBLICATIONS

S. Wolf & R. N. Tauber, *Silicon Processing for the VLSI Era Vol. 1: Process Technology* Lattice Press, Sunset Beach, Calif. (1986).

Kunii et al, "Si Surface Cleaning by $Si_2H_6$—$H_2$ Gas Etching and its Effects on Solid–Phase Epitaxy", *Japanese Journal of Applied Physics*, vol. 26, No. 11, (Nov. 1987), pp. 1816–1822.

Extended Abstracts (The 38th Spring Meeting, 1991); The Japan Society of Applied Physics and Related Societies No. 2., p. 739 . "Silty in Situ Pre Cleaning for low Temperature Epitaxial Growth" by Numano et al.

*Primary Examiner*—R. Bruce Breneman
*Assistant Examiner*—Linda J. Fleck
*Attorney, Agent, or Firm*—Lowe, Price, LeBlanc & Becker

[57] ABSTRACT

Disclosed is a semiconductor apparatus in which a single-crystalline thin film can be formed on a semiconductor substrate at a low temperature not higher than 800° C. and a method of manufacturing such a semiconductor apparatus. In this semiconductor apparatus and the manufacturing method thereof, a silane gas is supplied onto a single-crystalline silicon substrate under condition of a temperature not higher than approximately 540° C. and an amorphous silicon thin film is formed on a surface of the silicon substrate. At the same time, the amorphous silicon thin film is single-crystallized to form a single crystal silicon thin film, and single crystal silicon thin films are successively epitaxially grown. This enables those single crystal silicon thin films to be formed directly on the surface of the single-crystalline silicon substrate at a temperature lower than or equal to 800° C.

19 Claims, 21 Drawing Sheets

THIN FILM MANUFACTURING METHOD

This application is a division of application Ser. No. 08/016,441 filed Feb. 11, 1993 now abandoned.

BACKGROUND OF THE INVENTION

1. Field of the Invention

The present invention relates generally to semiconductor apparatuses and methods of fabricating the semiconductor apparatuses and, more particularly, to a semiconductor apparatus in which a crystallized thin film is formed on a substrate, and a method of fabricating such a semiconductor apparatus.

2. Description of the Background Art

A semiconductor apparatus in which a thin film made such as of silicon is epitaxially grown on a surface of a semiconductor substrate such as a silicon substrate has been conventionally known. FIG. 31 is a schematic diagram for use in explaining a method of fabricating such a conventional semiconductor apparatus. FIGS. 32–34 are cross-sectional views for use in explaining a process for fabricating the conventional semiconductor apparatus. FIG. 35 is a cross-sectional view of a semiconductor fabricating apparatus for use in a conventional thin film formation. A conventional semiconductor fabricating apparatus will now be described with reference to FIG. 35. This conventional semiconductor fabricating apparatus includes cylindrical reaction chambers 111 and 112, a susceptor 114 for supporting a single-crystalline silicon substrate 101, a lid 119 on which susceptor 114 is securely attached, an elevator 123 for moving lid 119 up and down, a gas supply unit 115 for supplying a silane gas, a nitrogen gas, a hydrogen gas or the like through a pipe 116 into reaction chamber 111 while regulating the flow of the gas, a vacuum pump 117 for exhausting reaction chamber 111 of gas or air through an exhaust pipe 118, a heater 120 for heating reaction chamber 111, a manifold 121 having an opening through which pipe 116 and exhaust pipe 118 run and which is used for accommodating susceptor 114 into reaction camber 111, and a frame 122 for fixedly placing manifold 121 and elevator 123 thereon.

By using the semiconductor fabricating apparatus thus structured, a thin film formation has been conventionally made in the following process.

With reference to FIGS. 31–35, a single-crystalline silicon substrate 101 is first cleaned with a solution of hydrofluoric acid (HF) under the condition of room temperature. A silicon oxide film ($SiO_2$) formed on a surface of the single-crystal silicon substrate is thereby removed. Single crystalline silicon substrate 101 is then rinsed with water, sprayed with a nitrogen gas and then dried, resulting in clean single crystalline silicon substrate 101 (see FIG. 32).

Then, with a lid 119 of the semiconductor fabricating apparatus moving downward, single crystalline silicon substrate 101 is mounted on susceptor 114. The temperature of reaction chamber 111 is now kept at 350° C. In this state, lifting elevator 123 allows susceptor 114 to enter into reaction chamber 111 and reaction chamber 111 is sealed off or closed airtightly by lid 119. Reaction chamber 111 is then exhausted of air through exhaust pipe 118 by pump 117.

A nitrogen gas ($N_2$) is then supplied from gas supply unit 115 into reaction chamber 111. The inside of reaction chamber 111 is substituted with the supplied nitrogen gas ($N_2$) and then maintained under a predetermined pressure (e.g., 10 Torr).

Since single crystalline silicon substrate 101 before introduced into reaction chamber 111 is at room temperature, single crystalline silicon substrate 101 is kept in reaction chamber 111 under a nitrogen gas ($N_2$) atmosphere until the substrate temperature reaches 350° C.

After the temperature of single crystalline silicon substrate 101 becomes uniformly 350° C., the temperature in reaction chamber 111 is still increased to 620° C. Single crystalline silicon substrate 101 is kept in reaction chamber 111 under the nitrogen gas ($N_2$) atmosphere until the respective temperatures of reaction chamber 111 and single crystalline silicon substrate 101 become uniformly 620° C. The surface of single crystalline silicon substrate 101 is oxidized by oxygen ($O_2$) and steam ($H_2O$) remaining in reaction chamber 111 before the temperature of substrate 101 rises from 350° C. to 620° C. This results in formation of a silicon oxide film ($SiO_x$) 102 on the surface of single crystalline silicon substrate 101 (see FIG. 33). The resultant silicon oxide film has a thickness of approximately 10–15Å.

After the respective temperatures of single crystalline silicon substrate 101 and reaction chamber 111 uniformly reach 620° C., a silane gas ($SiH_4$) is introduced from gas supply unit 115 into reaction chamber 111. This silane gas allows a silicon thin film 103 to grow on the surface of silicon oxide film 102 (see FIG. 34). After that, the interior of reaction chamber 111 is again substituted with a nitrogen gas ($N_2$).

Finally, after a pressure in reaction chamber 111 is returned to atmospheric pressure by employing the nitrogen gas ($N_2$), elevator 123 descends lid 119. Single-crystal silicon substrate 101 is then taken out from susceptor 114.

As described above, conventionally, the surface of single-crystal silicon substrate 101 is oxidized by oxygen ($O_2$) and steam ($H_2O$) left in reaction chamber 111 during the period that the temperature of single-crystal silicon substrate 101 increases from 350° C. to 620° C. Accordingly, silicon oxide film ($SiO_x$) 102 of approximately 10–15Å in thickness is formed on the surface of single-crystal silicon substrate 101.

If silicon thin film 103 is grown on such silicon oxide film 102 by using a silane gas, however, a disadvantage arises that silicon thin film 103 becomes a polycrystal silicon thin film 103 and consequently no single-crystalline thin film is obtained. A method of substitution with hydrogen ($H_2$) at a high temperature of approximately 1100° C. has been proposed in order to remove the above silicon oxide film 102. This method, however, adversely affects elements such that a diffusion layer constituting a transistor broadly extends since the method is adapted at a considerably high temperature. FIG. 36 is a sectional view showing the structure of a three-dimensional device for describing the problem in a method of replacing a silicon oxide film 102 by hydrogen at a high temperature of about 1110° C. as described above. With reference to FIG. 36, in the three-dimensional device, an insulator layer 206 having a contact hole is formed on a single-crystalline substrate 201. Then, a single-crystalline silicon layer 204 is formed so as to be electrically connected to single-crystalline semiconductor substrate 201 at the contact hole and extend on and along insulator layer 206. A first MOS transistor 202 is formed at a predetermined region on the main surface of single-crystalline semiconductor substrate 201 and a second MOS transistor 205 is formed at a predetermined region on the main surface of single-crystalline silicon layer 204. In the three-dimensional device having such a structure, a formation of single-crystalline silicon layer 204 requires a removal of a silicon oxide film (not shown) on the main surface of single-crystalline semiconductor substrate 201 with which single-crystalline silicon layer 204 contacts. In such a case, it is also possible to remove the silicon oxide film by a hydrogen replacement method requiring the above-described high temperature of 1100° C. However, the hydrogen replacement method requiring a high temperature of about 1100° C. involves a disadvantage that source/drain regions 203 constituting first MOS transistor 202 formed on the main surface of single-crystalline semiconductor substrate 201 are extended due to the high temperature. As a result, the transistor characteristics of first MOS transistor 202 vary.

Also, there is another disadvantage that since silicon oxide film 102 is as thick as 10–15Å (see FIG. 33), a contact resistance between single-crystal silicon substrate 101 and polycrystal silicon thin film 103 increases.

As has been described above, conventionally, it has been difficult to form a single-crystalline thin film without providing a heat treatment of a high temperature (1100° C.), i.e., a temperature not higher than 800° C. It has been also difficult to reduce a contact resistance between polycrystal silicon thin film 103 and single-crystal silicon substrate 101.

SUMMARY OF THE INVENTION

One object of the present invention is to obtain a semiconductor apparatus in which a single-crystalline thin film can be formed without exerting adverse inferences on elements.

Another object of the present invention is to reduce a contact resistance between a semiconductor substrate and a thin film formed on the substrate in a semiconductor apparatus.

A further object of the present invention is to form a single-crystalline thin film on a semiconductor substrate at a temperature not higher than 800° C. in a method of fabricating a semiconductor apparatus.

A still further object of the present invention is to reduce the thickness of an oxide film formed between a semiconductor substrate and a thin film formed on the substrate.

Still another object of the present invention is to reduce a contact resistance between a semiconductor substrate and a thin film formed on the substrate in a method of fabricating a semiconductor apparatus.

According to one aspect of the present invention, a semiconductor device includes: a single-crystalline semiconductor substrate having a main surface; and a crystallized thin film covering at least a part of the main surface and formed by growing an amorphous thin film on the single-crystalline semiconductor substrate while exposing the single-crystalline semiconductor substrate to an atmosphere including a material gas for forming the amorphous thin film, increasing the temperature of the atmosphere from a first prescribed temperature to a second prescribed temperature, single-crystallizing the amorphous thin film to form a solid phase epitaxial thin film by using the single-crystalline substrate as a seed during the increasing of the temperature of the atmosphere, and sustaining the atmosphere at the second temperature to grow vapor phase epitaxial thin film on the solid phase epitaxial thin film.

In operation, since the crystallized thin film covering at least a part of the main surface of the single-crystalline semiconductor substrate is formed by growing an amorphous thin film on the single-crystalline semiconductor substrate while exposing the single-crystalline semiconductor substrate to an atmosphere including a material gas for forming the amorphous thin film, increasing the temperature of the atmosphere from the first prescribed temperature to the second prescribed temperature, single-crystallizing the amorphous thin film to form a solid phase epitaxial thin film by using the single-crystalline substrate as a seed during the increasing of the temperature of the atmosphere, and sustaining the atmosphere at the second temperature to grow a vapor phase epitaxial thin film, a single-crystallized thin film can be directly formed on the single-crystalline semiconductor substrate without using a conventional hydrogen replacement method requiring a temperature of 1100° C. This prevents an expansion, as occurs in a conventional example, of a transistor diffusion region formed on the single-crystalline semiconductor substrate which is a lower layer, at a formation of a single-crystalline silicon layer which is an upper layer, in a third-dimensional device, for example.

According to another aspect of the present invention, a method of fabricating a semiconductor apparatus includes the steps of: locating a single-crystalline semiconductor substrate in a chamber; forming an amorphous thin film on the single-crystalline semiconductor substrate by introducing a material gas for the amorphous thin film into the chamber; increasing the temperature of an atmosphere in the chamber in line with the formation of the amorphous thin film and forming a crystallized thin film by crystallizing the amorphous thin film during the increasing of the temperature of the atmosphere; and sustaining the temperature of the atmosphere in the chamber at a prescribed temperature, after the formation of the crystallized thin film, to grow a vapor phase epitaxial thin film on the crystallized thin film.

In operation, since the amorphous thin film is formed on the single-crystalline semiconductor substrate by introducing the material gas for the amorphous thin film into the chamber prior to oxidation of the surface of the single-crystalline semiconductor substrate by oxygen ($O_2$) or steam ($H_2O$) left in the chamber, oxidation of the single-crystalline semiconductor substrate can be effectively prevented. In addition, since the temperature of the atmosphere in the chamber is increased, in line with the formation of the amorphous thin film, to crystallize the amorphous thin film during the increasing of the temperature and thereafter the temperature of the atmosphere is sustained at a prescribed temperature, another crystallized thin film is made by vapor phase growth on the crystallized thin film by using the crystallized thin film, which is the crystallization of the amorphous thin film, as a seed. Furthermore, since the foregoing fabrication processes are carried out in the same chamber, they can be simplified.

According to another aspect of the present invention, a method of fabricating a semiconductor apparatus is directed to a method of fabricating a semiconductor apparatus in which a crystallized thin film is formed on a substrate, including the steps of: forming an amorphous thin film on the substrate in the range of room temperature to approximately 540° C., with the substrate retained in an atmosphere including a material gas of the thin film; and forming a crystallized thin film by crystallizing the amorphous thin film while the amorphous thin film is formed.

In operation, since the amorphous thin film is formed on the substrate with priority in the range of room temperature to approximately 540° C., with the substrate retained in the atmosphere including the material gas of the thin film, the amorphous thin film is formed directly on the substrate without the substrate surface being oxidized by oxygen or steam left in a reaction chamber.

According to still another aspect of the present invention, a method of fabricating a semiconductor apparatus is directed to a method of fabricating a semiconductor apparatus in which a crystallized thin film is formed on a substrate, including the steps of: forming an amorphous thin film on the substrate with the substrate retained in an atmosphere including a material gas of the thin film; forming a first crystallized thin film by crystallizing the amorphous thin film while the amorphous thin film is formed; and forming a second crystallized thin film on the first crystallized thin film subsequently to the formation of the first crystallized thin film.

In operation, the amorphous thin film is formed on the substrate being retained in the atmosphere including the material gas of the thin film. The amorphous thin film is then crystallized while it is formed, whereby the first crystallized thin film is formed. After the formation of the first crystallized thin film, a second crystallized thin film is subsequently formed on the first crystallized thin film. That is, the amorphous thin film is formed on the substrate prior to the oxidization of the substrate by the oxygen or steam. Thus, when a single crystal semiconductor substrate is used as the substrate, an amorphous thin film is formed directly on the single crystal semiconductor substrate, and the amorphous thin film is then single-crystallized, with the single crystal semiconductor substrate used as a seed, whereby a single-crystalline thin film can be easily formed on the semiconductor substrate. Alternatively, when an insulator substrate is employed as the substrate, no oxide film is further formed on a surface of the insulator substrate by oxygen or steam left in the formation of an amorphous thin film on the insulator substrate, and hence, the amorphous thin film is directly formed on the insulator substrate. Accordingly, when that amorphous thin film is polycrystallized to form a polycrystalline thin film, a contact resistance between the polycrystalline thin film and a conductor layer in contact with the poly-crystalline thin film with the insulator substrate interposed therebetween is decreased as compared to the conventional.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described with reference to the drawings.

A description will now be given on a first embodiment of a method of manufacturing a semiconductor apparatus of the present invention with reference to FIGS. 1–6 and FIG. 35.

Figure 1:
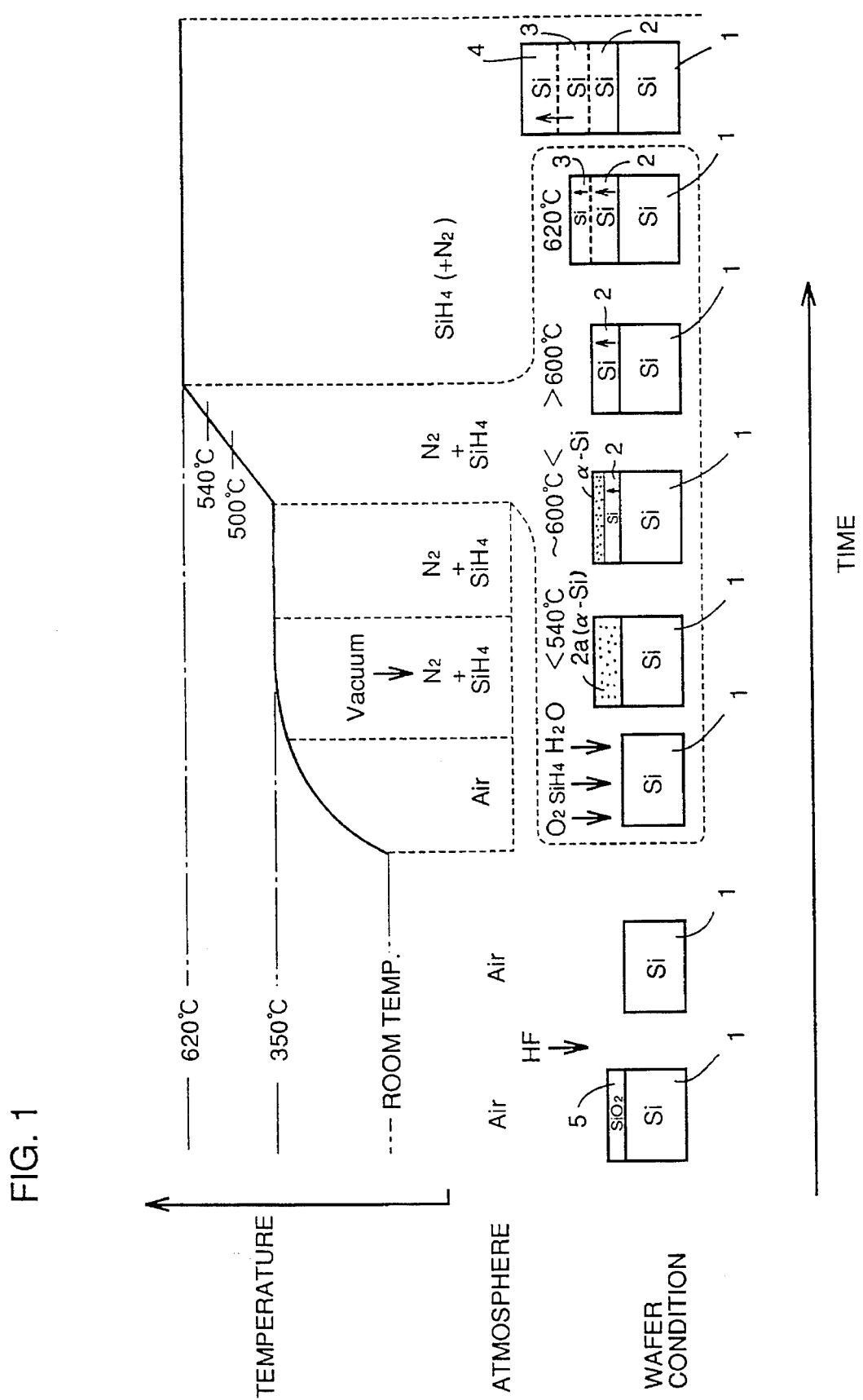
FIG. 1 is a schematic diagram for use in explaining a first embodiment of a method of manufacturing a semiconductor apparatus in accordance with the present invention.
Figure 2:
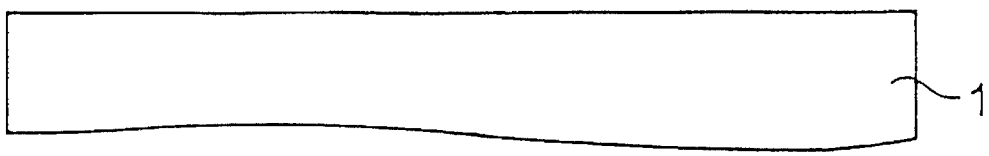
FIG. 2 is a cross-sectional view for use in explaining a first step of a manufacturing process in the method of the first embodiment shown in FIG. 1.

In this embodiment, as shown in FIG. 1, a surface of a single-crystal silicon substrate 1 is first cleaned with a solution of a hydrofluoric acid (HF) at room temperature as in the conventional example. This leads to removal of a native oxide film ($SiO_2$) 5 formed on the surface of single-crystal silicon substrate 1. Single crystal semiconductor substrate 1 is then rinsed with water and dried by, for example, being sprayed with a nitrogen gas. This results in clean single-crystalline silicon substrate 1 (see FIG. 2).

Figure 35:
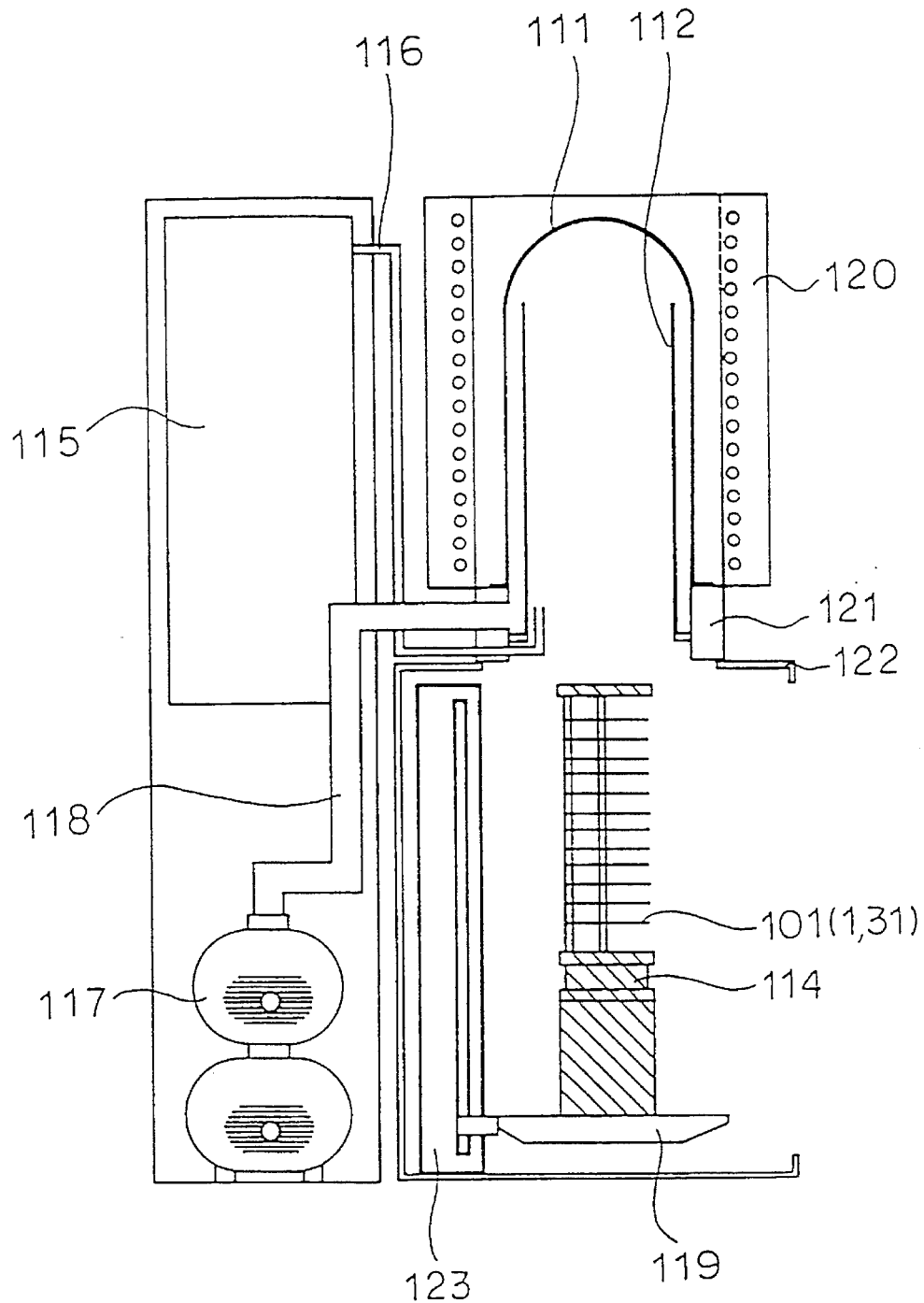
FIG. 35 is a cross-sectional view showing a semiconductor fabricating apparatus for use in a conventional semiconductor apparatus manufacturing method.
Figure 36:
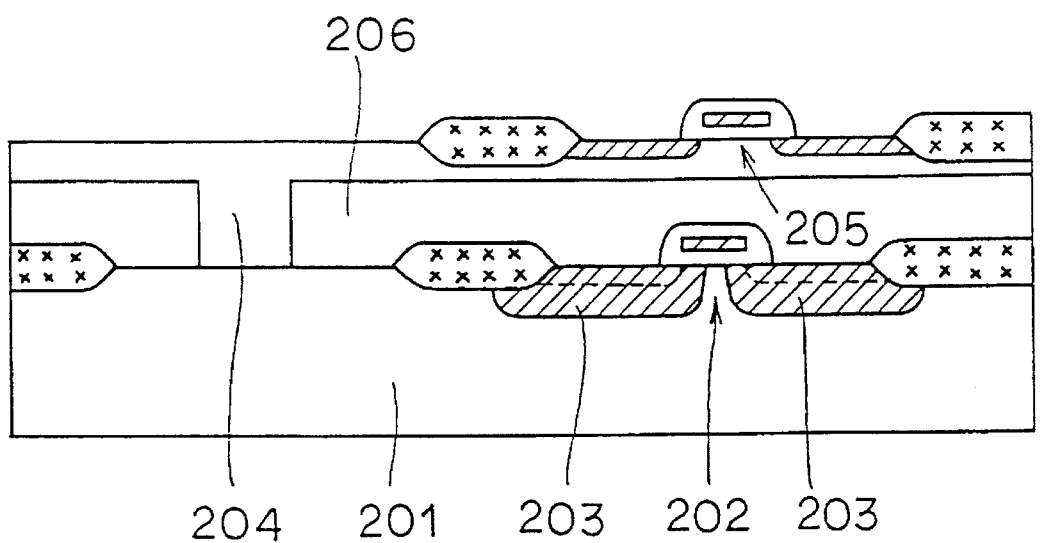
FIG. 36 is a sectional view illustrating the problem to occur in the hydrogen replacement method applied to a conventional three-dimensional device with a single-crystalline silicon layer used as an upper layer.

As shown in FIG. 35, single crystal silicon substrate 1 is then placed on a susceptor 114 of a conventional semiconductor fabricating apparatus. The interior of a reaction chamber 111 is maintained at 350° C. in this state. From this state, single-crystalline silicon substrate 1 is introduced into reaction chamber 111 by moving a lid 119 upward by an elevator 123. Reaction chamber 111 is then closed or sealed off by lid 119. After that, the internal air of reaction chamber 111 is expelled through an exhaust pipe 118 by using a vacuum pump 117.

A silane gas ($SiH_4$) and nitrogen gas ($N_2$) are supplied from a gas supply unit 115 through a pipe 116 into reaction chamber 111. The supplied silane gas ($SiH_4$) and nitrogen gas ($N_2$) are substituted for the interior of reaction chamber 111. With reaction chamber 111 maintained at 350° C., not only the nitrogen gas but also the silane gas ($SiH_4$) being a material gas of a thin film to be formed is thus supplied in this embodiment. After the substitution of the silane gas and the nitrogen gas for the inside of reaction chamber 111 under condition of a temperature of 350° C., the internal pressure of reaction chamber 111 is kept at 0.2–0.3 Torr. In this state, a flow rate of $SiH_4/N_2$ is preferably 20–200/300 sccm, and more preferably, 200/300 sccm. A partial pressure of $SiH_4$ is preferably 0.0125–0.12 Torr, and more preferably, about 0.0125 Torr. In this state, the temperature of single-crystalline silicon substrate 1 is waited for uniformly increasing to 350° C.

Figure 3:
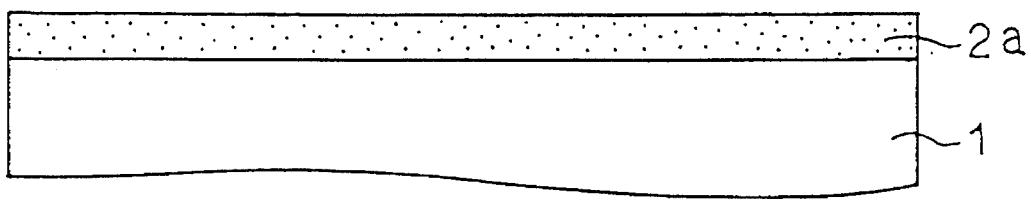
FIG. 3 is a cross-sectional view for use in explaining a second step of the manufacturing process in the method of the first embodiment shown in FIG. 1.

After that, the internal temperature of reaction chamber 111 is raised to a predetermined temperature for formation of a thin film, e.g., 620° C. In the process in which the temperature of single crystal semiconductor substrate 1 rises from 350° C. to 620° C., an amorphous silicon thin film 2a is formed on single-crystalline silicon substrate 1 by the silane gas ($SiH_4$), as shown in FIGS. 1 and 3. That is, the amorphous silicon thin film 2a is deposited on the single-crystalline silicon substrate 1 by the introduced silane gas ($SiH_4$) prior to the oxidization of the surface of the single-crystalline silicon substrate by oxygen ($O_2$) or steam ($H_2O$) left in reaction chamber 111. Accordingly, amorphous silicon thin film 2a is formed directly without a silicon oxide film formed on the surface of substrate 1. This amorphous silicon thin film 2a is formed under condition of a temperature lower than approximately 540° C.

The amorphous silicon thin film 2a formed on the surface of substrate 1 becomes gradually single-crystallized with single-crystalline silicon substrate 1 used as a seed while the amorphous silicon thin film 2a is formed.

Figure 4:
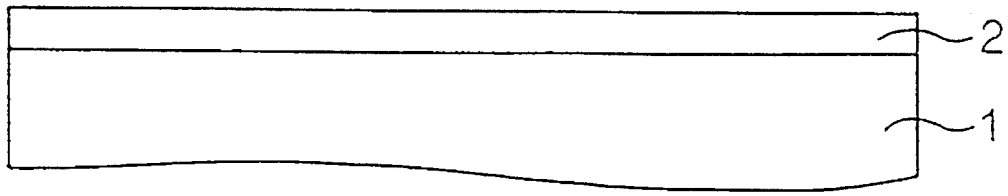
FIG. 4 is a cross-sectional view for use in explaining a third step of the manufacturing process in the method of the first embodiment shown in FIG. 1.
Figure 7:
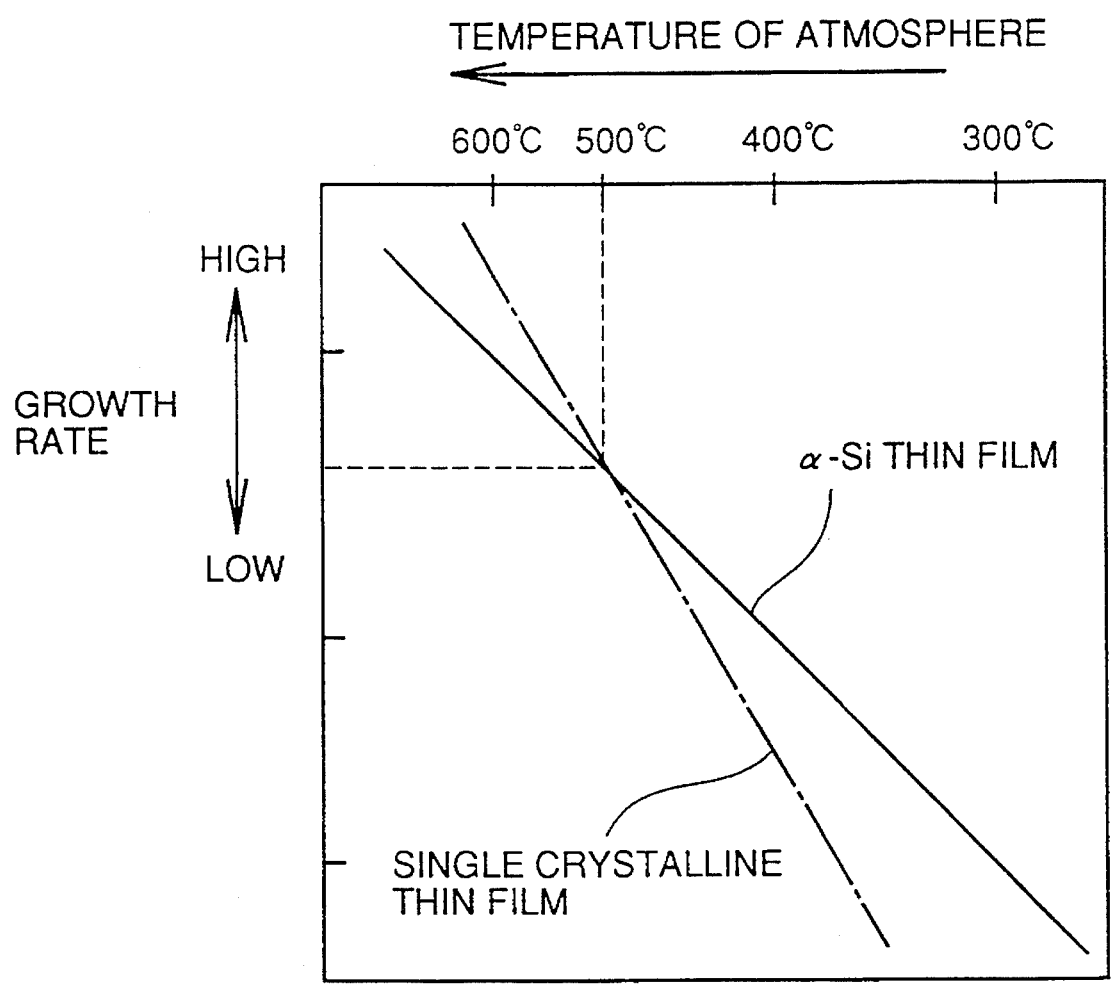
FIG. 7 is a correlation diagram showing a relationship between growth rates of an amorphous silicon thin film and a single-crystalline silicon thin film and the temperature of an atmosphere.

That is to say, amorphous silicon thin film 2a is further formed and also gradually single-crystallized by solid phase epitaxial growth with single-crystalline silicon substrate 1 used as a seed. This causes a single crystal silicon thin film 2 to gradually grow on the surface of silicon substrate 1. With the increase in temperature, a growth rate of single crystal silicon thin film 2 becomes higher than that of amorphous silicon thin film 2a. FIG. 7 is a correlation diagram showing a relationship between the temperature of an atmosphere and growth rates of amorphous silicon thin film 2a and single-crystalline silicon thin film 2. It can be seen from FIG. 7 that the growth rate of amorphous silicon thin film 2a is higher than that of single-crystalline silicon thin film 2 at a temperature of 500° C. or below. Then, it can be also seen that the growth rate of single-crystalline silicon thin film 2 is higher than that of amorphous silicon thin film 2a at a temperature of 500° C. or above. Therefore, at a temperature of 500° C. or above, single-crystalline silicon thin film 2, using single-crystalline silicon substrate 1 as a seed, grows faster than amorphous silicon thin film 2a as the temperature increases. As a result, with the temperature increase, a growth level of single-crystalline silicon thin film 2 catches up with that of amorphous silicon thin film 2a. When the temperature of silicon substrate 1 reaches approximately 600° C., all of amorphous silicon thin film 2a is single-crystallized as shown in FIG. 4. This results in a state where only single crystal silicon thin film 2 is formed on single-crystalline silicon substrate 1.

Figure 5:
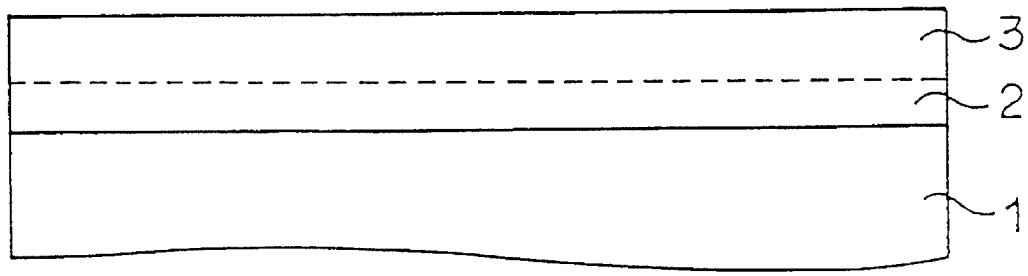
FIG. 5 is a cross-sectional view for use in explaining a fourth step of the manufacturing process in the method of the first embodiment shown in FIG. 1.

If the temperature of single-crystalline silicon substrate 1 further increases to approximately 600°–620° C., then a single crystal silicon thin film 3 starts epitaxially growing in a vapor phase on the surface of single crystal silicon thin film 2, as shown in FIG. 5.

Figure 6:
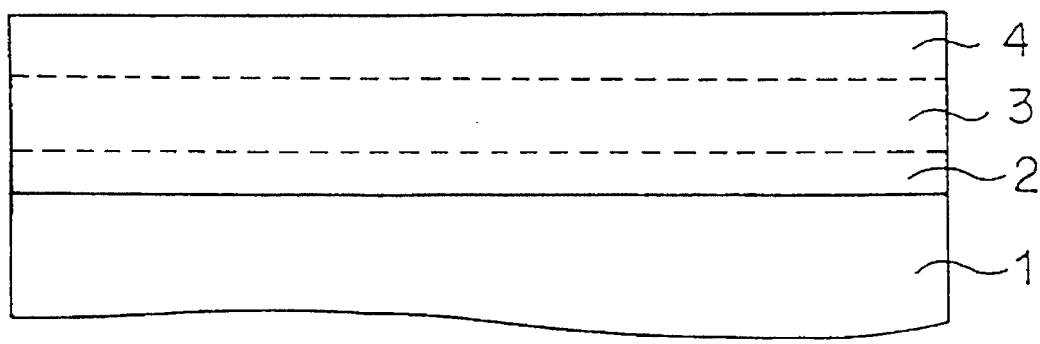
FIG. 6 is a cross-sectional view for use in explaining a fifth step of the manufacturing process in the method of the first embodiment shown in FIG. 1.

After single-crystalline silicon substrate 1 is then raised uniformly to approximately 620° C., only the silane gas ($SiH_4$) is supplied from gas supply unit 115 (see FIG. 35) into reaction chamber 111 (see FIG. 35). The supplied silane gas causes a single crystal silicon thin film 4 to make a vapor phase epitaxial growth on single crystal silicon thin film 3, as shown in FIG. 6.

In such a manner, a single crystal silicon thin film comprised of single crystal silicon thin films 2, 3 and 4 is thus formed on single-crystalline silicon substrate 1.

Finally, a nitrogen gas ($N_2$) is introduced into reaction chamber 111 to bring the internal pressure of reaction chamber 111 back to atmospheric pressure, and lid 119 is thereafter lowered by elevator 123, as shown in FIG. 35. After that, single-crystalline silicon substrate 1 is taken out.

As described above, in the manufacturing method of the first embodiment, the interior of reaction chamber 111 is maintained under a mixed atmosphere of silane gas ($SiH_4$) and nitrogen gas ($N_2$) under conditions on which single-crystalline silicon substrate 1 is at 350° C. or more. This allows amorphous silicon thin film 2a to be deposited on the surface of single-crystalline silicon substrate 1 in the range of 350° C. to approximately 540° C. Then, amorphous silicon thin film 2a is further deposited in the range of not more than approximately 600° C., and amorphous silicon thin film 2a is also single-crystallized with silicon substrate 1 used as a seed. This causes single crystal silicon thin film 2 to gradually make a solid phase epitaxial growth on the surface of single-crystalline silicon substrate 1. As the temperature becomes increased, the growth rate of single-crystalline silicon thin film 2 becomes higher than that of amorphous silicon thin film 2a. When the temperature reaches approximately 600° C., all of amorphous silicon thin film 2a is single-crystallized, and only single crystal silicon thin film 2 is formed on single-crystalline silicon substrate 1. Further, single crystal silicon thin film 3 is made continuously by a vapor phase epitaxial growth on the surface of single crystal silicon thin film 2. Finally, after the temperature of silicon substrate 1 becomes uniformly 620° C., only silane gas is introduced. This results in a vapor phase epitaxial growth of single crystal silicon thin film 4 on single crystal silicon thin film 3.

As described above, in this embodiment, single crystal silicon thin films (2, 3, 4) can easily be epitaxially grown on single-crystalline silicon substrate 1 at a temperature not higher than 800° C. Accordingly, a contact resistance between single-crystalline silicon substrate 1 and single crystal silicon thin film 2 is also reduced as compared to the conventional. In addition, the present embodiment, in which a series of fabricating processes is carried out in the same chamber, can simplify the fabricating processes. Amorphous silicon thin film 2a may be fabricated under any temperature conditions within the range of room temperature to 540° C. In addition, although the temperature is continuously increased from 350° C. to 620° C. in the present embodiment, the present invention is not limited thereto but the temperature may be intermittently increased.

Figure 8:
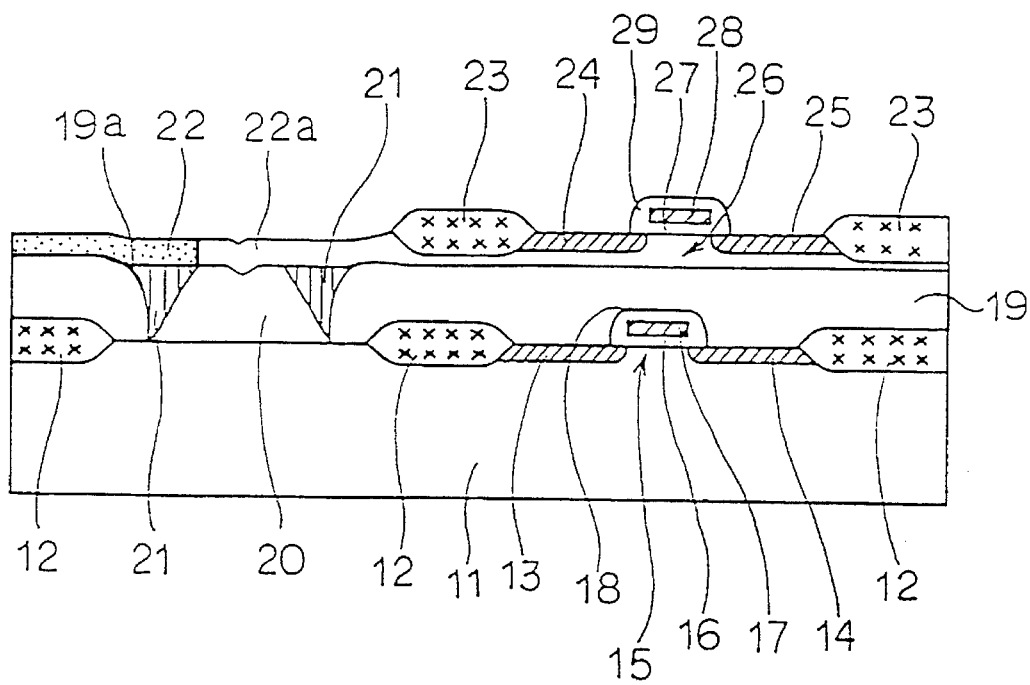
FIG. 8 is a cross-sectional view showing a structure in which the method of the first embodiment shown in FIG. 1 is applied to a three-dimensional device.

With reference to FIG. 8, this three-dimensional device includes a single-crystalline silicon substrate 11, a field oxide film 12 for elementary isolation, formed in a predetermined region on a surface of single-crystalline silicon substrate 11, a pair of n type source/drain regions 13 and 14 formed in a region enclosed by field oxide film 12 with a predetermined spacing from each other to interpose a channel region 15 therebetween, a gate electrode 17 formed over channel region 15 with a gate oxide film 16 interposed therebetween, and an oxide film 18 formed to cover gate electrode 17. The three-dimensional device further includes an interlayer insulation film 19 formed to cover an overall surface and having an opening 19a in a predetermined region on single-crystalline silicon substrate 11, a single crystal silicon thin film 20 which is made contact with single-crystalline silicon substrate 11 in opening 19a and the length of which along a main surface of silicon substrate 11 decreases upward with an increase in its height from the substrate surface, a polycrystal silicon thin film 21 interposed between single crystal silicon thin film 20 and a sidewall of opening 19a, a single crystal silicon thin film 22a made contact with single crystal silicon thin film 20 and formed to extend over polycrystal silicon thin film 21 and interlayer insulation film 19, an amorphous silicon thin film 22 connected to single crystal silicon thin film 22a, a field oxide film 23 for elementary isolation, formed in a predetermined region of single crystal silicon thin film 22a, a pair of p type source/drain regions 24 and 25 formed to interpose a channel region 26 therebetween in a region enclosed by field oxide film 23, a gate electrode 28 formed over channel region 26 with a gate oxide film 27 interposed therebetween, and an oxide film 29 formed to cover gate electrode 28.

A pair of n type source/drain regions 13 and 14 and gate electrode 16 constitute an n channel MOS transistor in a lower layer. A pair of p type source/drain regions 24 and 25 and gate electrode 28 constitute a p channel MOS transistor in an upper layer.

This three-dimensional device employs the aforementioned manufacturing method of the first embodiment for the purpose of formation of single crystal silicon thin film 20 as will be described later.

A description will now be made on a manufacturing process of the three-dimensional device adapting the manufacturing method of the first embodiment with reference to FIGS. 8 and 9–14.

Figure 9:
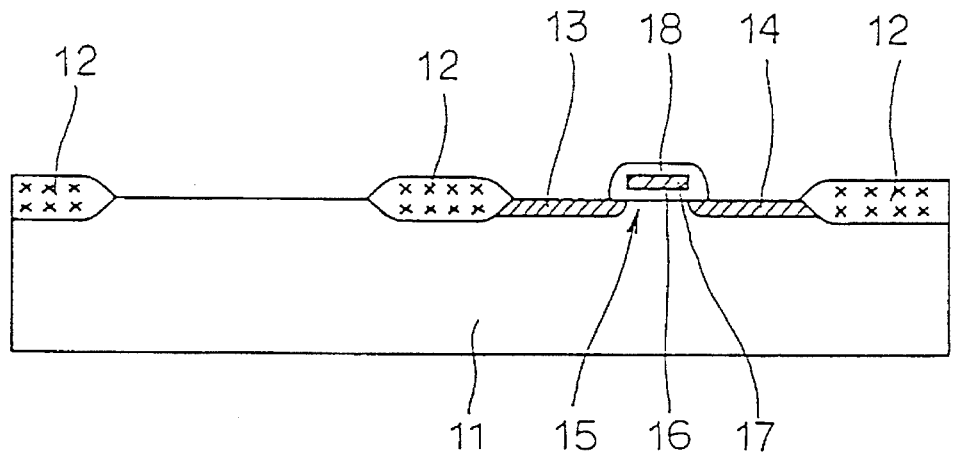
FIG. 9 is a cross-sectional view for use in explaining a first step of a manufacturing process of the three-dimensional device shown in FIG. 8.

As shown in FIG. 9, field oxide film 12 for isolation is first formed in a predetermined region on the main surface of single-crystalline silicon substrate 11. Gate electrode 17 is formed over single-crystalline silicon substrate 11 in a region surrounded by field oxide film 12, with gate oxide film 16 interposed between silicon substrate 11 and gate electrode 17. A pair of n type source/drain regions 13 and 14 are then formed. Oxide film 18 is formed to cover gate electrode 17.

Figure 10:
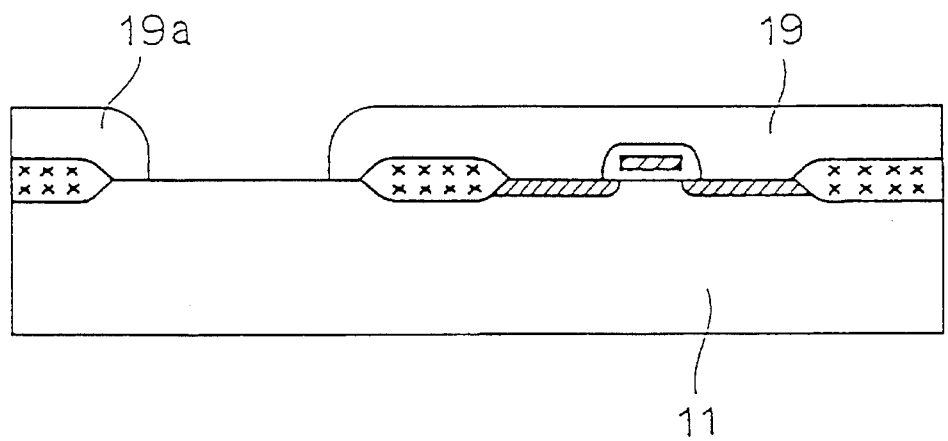
FIG. 10 is a cross-sectional view for use in explaining a second step of the manufacturing process of the three-dimensional device shown in FIG. 8.

As shown in FIG. 10, after interlayer insulation film 19 made of a $SiO_2$ film is formed over the entire surface, a contact hole 19a is formed in a predetermined region by using photolithography and etching technique. This exposes a predetermined region on the surface of single-crystalline silicon substrate 11.

Figure 11:
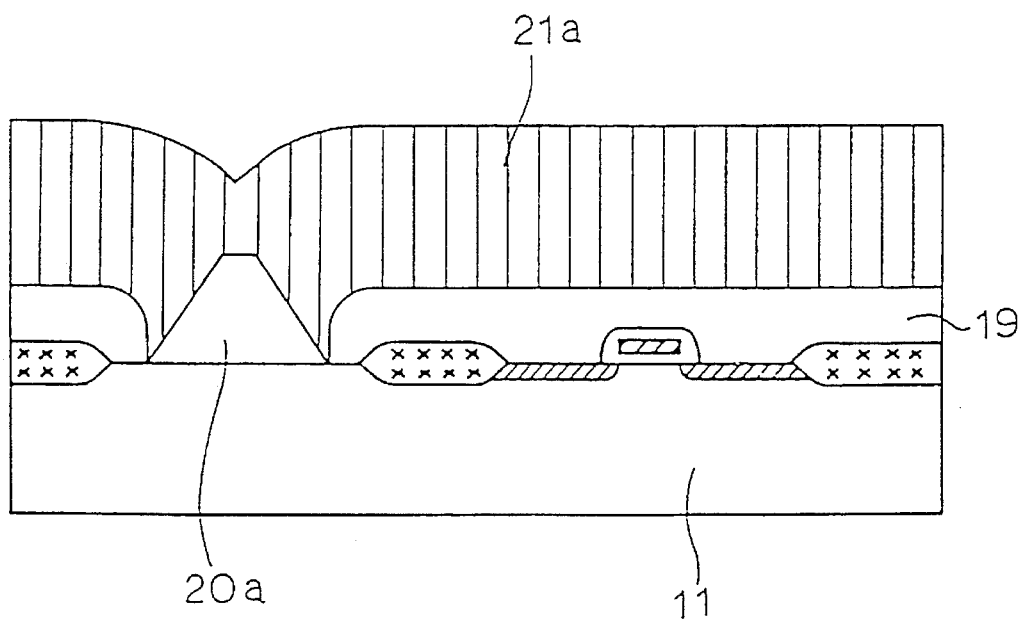
FIG. 11 is a cross-sectional view for use in explaining a third step of the manufacturing process of the three-dimensional device shown in FIG. 8.

Referring then to FIG. 11, by employing the manufacturing method of the first embodiment described in FIGS. 1–6, single crystal silicon thin film 20 is then formed which comes into contact with exposed silicon substrate 11 and the length of which along the main surface of substrate 11 becomes decreased upward with an increase in its height from the substrate surface. At the same time, a polycrystal silicon thin film 21a is formed on the surface of interlayer insulation film 19. The temperature at which single crystal silicon thin film 20 is formed is approximately 620° C.

Figure 12:
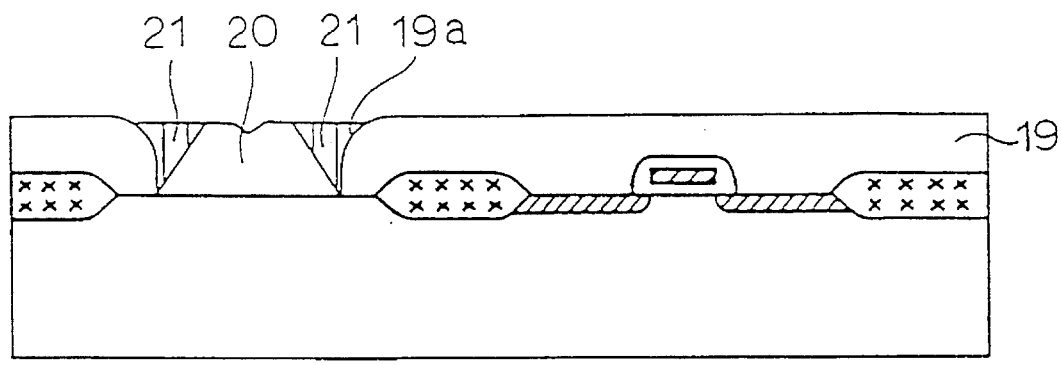
FIG. 12 is a cross-sectional view for use in explaining a fourth step of the manufacturing process of the three-dimensional device shown in FIG. 8.

Then, as shown in FIG. 12, single crystal silicon thin film 20 and polycrystal silicon thin film 21 of a predetermined shape are formed by etching back the overall surface.

Figure 13:
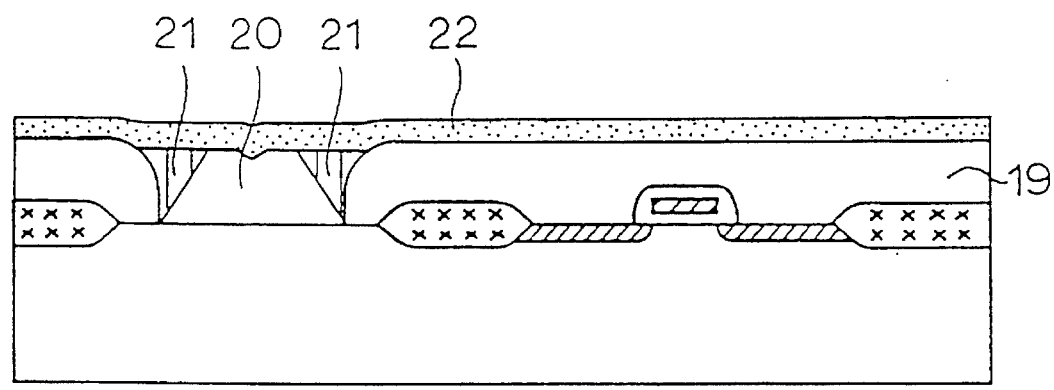
FIG. 13 is a cross-sectional view for use in explaining a fifth step of the manufacturing process of the three-dimensional device shown in FIG. 8.

Amorphous silicon thin film 22 is then deposited on single crystal silicon thin film 20, polycrystal silicon thin film 21 and interlayer insulation film 19 as shown in FIG. 13.

Figure 14:
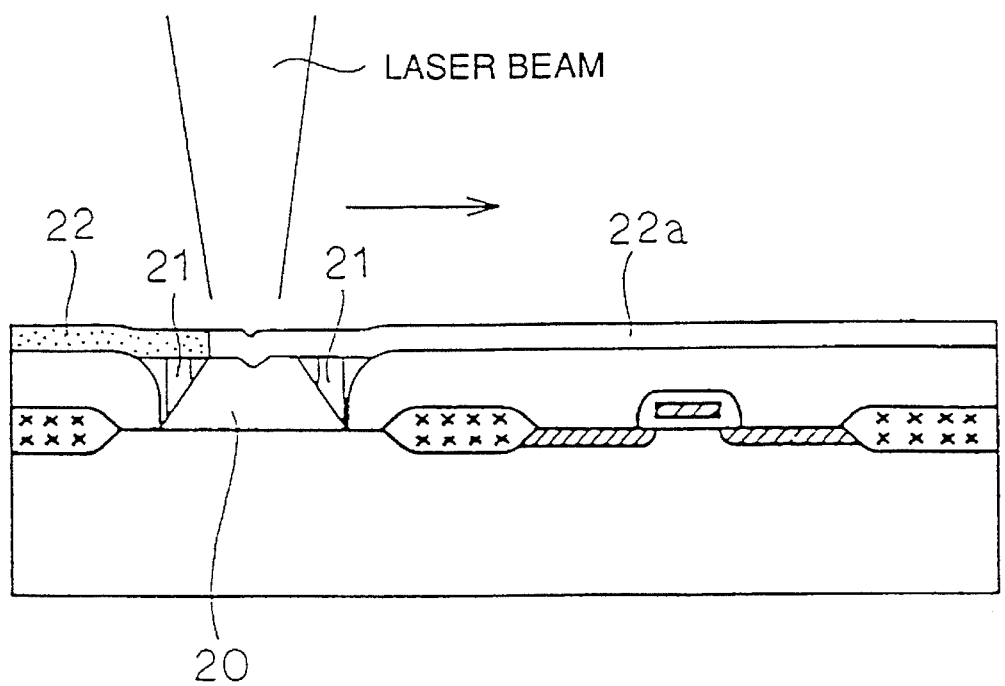
FIG. 14 is a cross-sectional view for use in explaining a sixth step of the manufacturing process of the three-dimensional device shown in FIG. 8.

Irradiating a predetermined region of amorphous silicon thin film 22 (see FIG. 13) with a laser beam results in formation of single crystal silicon thin film 22a as shown in FIG. 14.

Finally, field oxide film 23 for isolation is formed in a predetermined region of single crystal silicon thin film 22a as shown in FIG. 8. Gate electrode 28 is then formed over single crystal silicon thin film 22a in a region surrounded by field oxide film 23, with gate oxide film 27 interposed between single crystal silicon thin film 22a and gate electrode 28. A pair of p type source/drain regions 24 and 25 are formed by ion implantation, using gate electrode 28 and gate oxide film 27 as masks. Oxide film 29 is then formed to cover gate electrode 28.

In such a manner, the three-dimensional device is completed which includes an n channel MOS transistor and a p channel MOS transistor formed, respectively, in the first and second layers. Since single crystal silicon thin film 20 can be formed directly on single-crystalline silicon substrate 11 under condition of a temperature of approximately 620° C. in this three-dimensional device, there is no need to conduct a conventional high-temperature (1100° C.) heat treatment for removal of the oxide film on single-crystalline silicon substrate 11. This effectively prevents diffusion of source/drain regions 13 and 14 constituting the first layer MOS transistor by a high-temperature heat treatment. This makes it possible to form a very small element in the first layer and consequently to achieve a faster operation of the device.

A description will now be made on a second embodiment of a semiconductor apparatus manufacturing method with reference to FIGS. 15 and 16–20 and 35.

Figure 15:
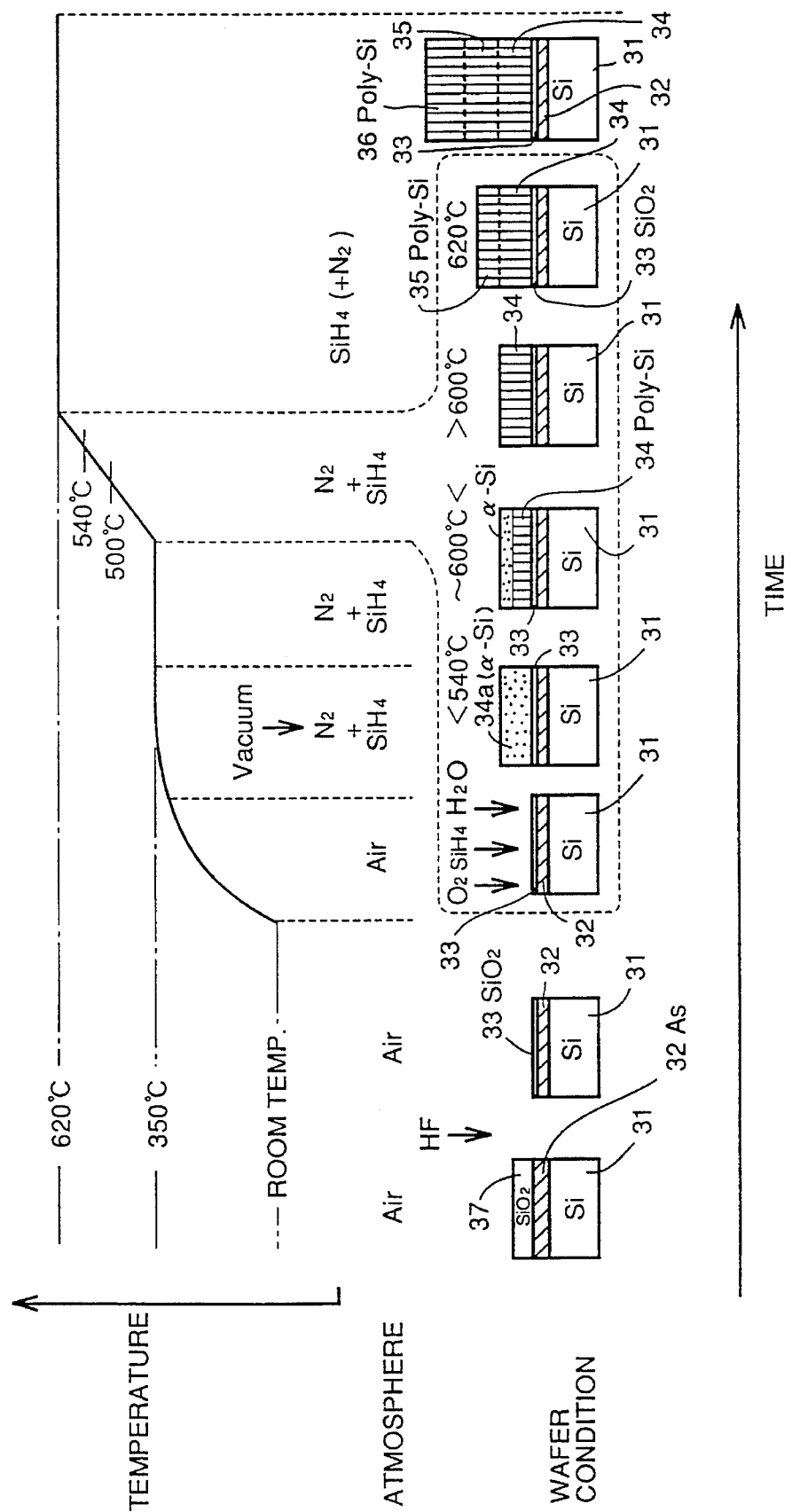
FIG. 15 is a schematic diagram for use in explaining a second embodiment of a method of manufacturing a semiconductor apparatus in accordance with the present invention.
Figure 16:
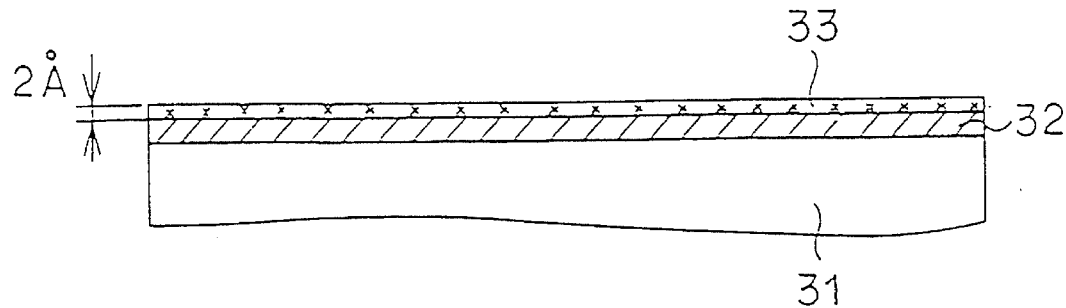
FIG. 16 is a cross-sectional view for use in explaining a first step of a manufacturing process in the method of the second embodiment shown in FIG. 15.

As shown in FIG. 15, in this manufacturing method of the second embodiment, a single-crystalline silicon substrate 31 is employed which has an impurity region 32 formed by doping arsenic (As) of $2 \times 10^{20}$ cm$^{-3}$ into a surface of the substrate by ion implantation. Single-crystalline silicon substrate 31 having impurity region 32 is cleaned with a solution of hydrofluoric acid (HF) under condition of room temperature. This removes a native oxide film (SiO$_2$) 37 formed on the surface of single-crystalline silicon substrate 31. After that, single-crystalline silicon substrate 31 is rinsed with water, sprayed with a nitrogen gas (N$_2$) and dried. Silicon substrate 31 having impurity region 32 is liable to be oxidized also during rinsing, so that a thin native oxide film (SiO$_2$) 33 of approximately 2Å is formed on the surface of silicon substrate 31.

Such silicon substrate 31 is placed on a susceptor 114 of the semiconductor fabricating apparatus shown in FIG. 35. The temperature of a reaction chamber 111 in the semiconductor fabricating apparatus is maintained at approximately 350° C. at that time. In this state, susceptor 114 is introduced into reaction chamber 111 by lifting a lid 119 by using an elevator 123. Lid 119 closes or seals off reaction chamber t11. After that, the air in reaction chamber 111 is expelled through an exhaust pipe 118 by using a vacuum pump 117.

A silane gas (SiH$_4$) and a nitrogen gas (N$_2$) are then supplied into reaction chamber 111 through a pipe 116 from a gas supply unit 115. The supplied silane gas and nitrogen gas are substituted for the interior of reaction chamber 111. An internal pressure of reaction chamber 111 is then maintained to be, e.g., 0.2–0.3 Torr. Single-crystalline silicon substrate 31 is waited for uniformly reaching 350° C.

Figure 17:
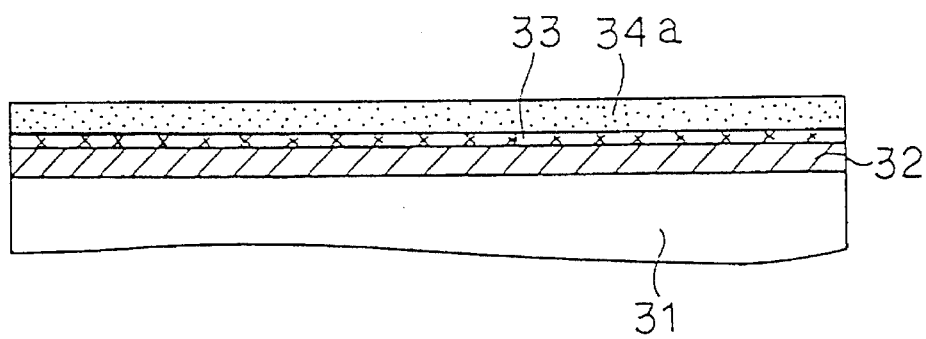
FIG. 17 is a cross-sectional view for use in explaining a second step of the manufacturing process in the method of the second embodiment shown in FIG. 15.

The temperature of the inside of reaction chamber 111 is then raised continuously to approximately 620° C. being a temperature for formation of a thin film. The embodiment is not restricted to this, the temperature may be raised discontinuously to approximately 620° C. In the process in which the temperature is raised from 350° C. to 620° C., an amorphous silicon thin film 34a is formed on native oxide film 33 within the range of 350° C. to approximately 540° C., as shown in FIGS. 15 and 17. That is, the amorphous silicon thin film 2a is deposited on the native oxide film (SiO$_2$) 33 by the introduced silane gas (SiH$_4$) prior to the further oxidation of the native oxide film 33 by oxygen (O$_2$) or steam (H$_2$O) left in reaction chamber 111. Accordingly, native oxide film (SiO$_2$) 33 is not further oxidized and amorphous silicon thin film 34a is directly formed on native oxide film 33. In this state, the flow rate of SiH$_4$/N$_2$ is preferably 20–200/300 sccm, and more preferably, 200/300 sccm and the pressure in the reaction chamber is about 0.2–0.3 Torr. A partial pressure of SiH$_4$ is preferably 0.0125–0.12 Torr, and more preferably, about 0.0125 Torr. Amorphous silicon thin film 34a may be formed at a temperature not higher than 350° C. but not lower than room temperature.

Figure 18:
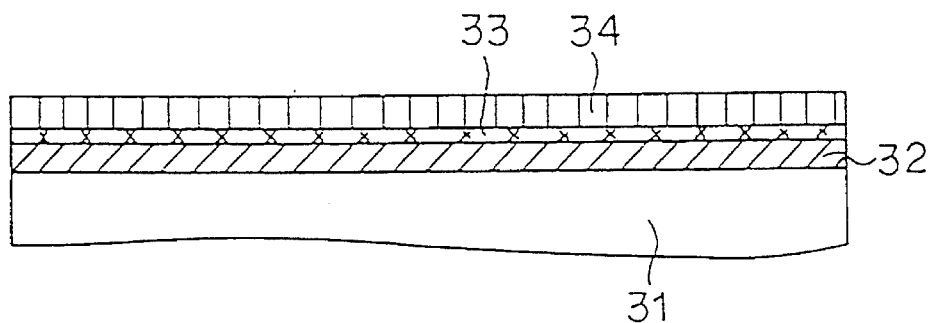
FIG. 18 is a cross-sectional view for use in explaining a third step of the manufacturing process in the method of the second embodiment shown in FIG. 15.
Figure 19:
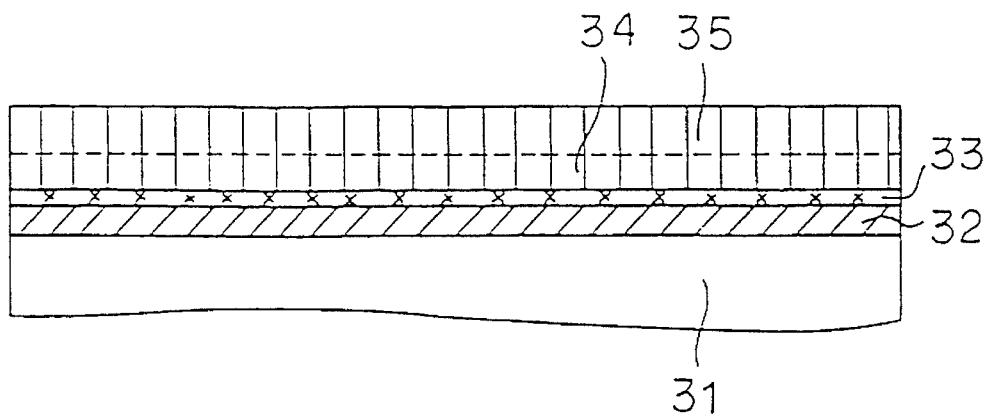
FIG. 19 is a cross-sectional view for use in explaining a fourth step of the manufacturing process in the method of the second embodiment shown in FIG. 15.

The amorphous silicon thin film 34a becomes gradually polycrystallized from the surface of native oxide film 33 while the amorphous silicon thin film 34a is formed. That is to say, amorphous silicon thin film 34a is further grown and also amorphous silicon thin film 34a on the surface of native oxide film 33 is gradually crystallized, whereby a polycrystal silicon thin film 34 is grown. With an increase in temperature, the growth rate of polycrystal silicon thin film 34 becomes higher than that of amorphous silicon thin film 34a. Then, if the temperature is approximately 600° C., all of amorphous silicon thin film 34a becomes polycrystal silicon thin film 34, as shown in FIGS. 15 and 18. A polycrystal silicon thin film 35 grows further continuously on polycrystal silicon thin film 34, as shown in FIGS. 15 and 19.

Figure 20:
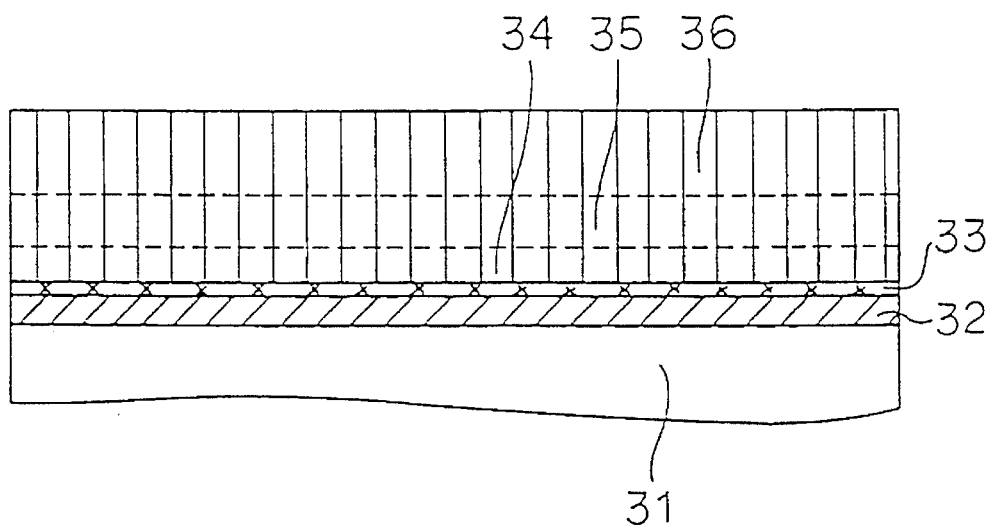
FIG. 20 is a cross-sectional view for use in explaining a fifth step of the manufacturing process in the method of the second embodiment shown in FIG. 15.

After single-crystalline silicon substrate 31 reaches uniformly 620° C., only silane gas (SiH$_4$) is introduced into reaction chamber 111 (see FIG. 35). The introduced silane gas causes a polycrystal silicon thin film 36 to grow continuously on the surface of polycrystal silicon thin film 35, as shown in FIGS. 15 and 20. In such a manner, polycrystal silicon thin films (34, 35, 36) can be formed over polycrystal silicon substrate 31 with native oxide film 33, having a small thickness of approximately 2Å, interposed therebetween.

As described above, if single-crystalline silicon substrate 31 has impurity region 32 on its surface, it is difficult to completely remove native oxide film 33. In such a case, in the second embodiment, thin native oxide film 33 is effectively prevented from being oxidized by oxygen (O$_2$) or steam (H$_2$O) left in the reaction chamber, and an increase in the thickness of native oxide film 33 is effectively prevented. That is, a silane gas (SiH$_4$) being a material gas of a thin film is already introduced under a temperature condition of 350° C. Therefore, the silane gas can effectively prevent further oxidation of the surface of thin native oxide film 33 and allows amorphous silicon film 34a to be formed directly on a thin native oxide film (SiO$_2$). Consequently, since a thin native oxide film (SiO$_2$) having a thickness of approximately 2Å is formed between polycrystal silicon thin film 34 formed finally and impurity region 32, a contact resistance between polycrystal silicon thin film 34 and impurity region 32 can be reduced more as compared to the conventional.

Figure 21:
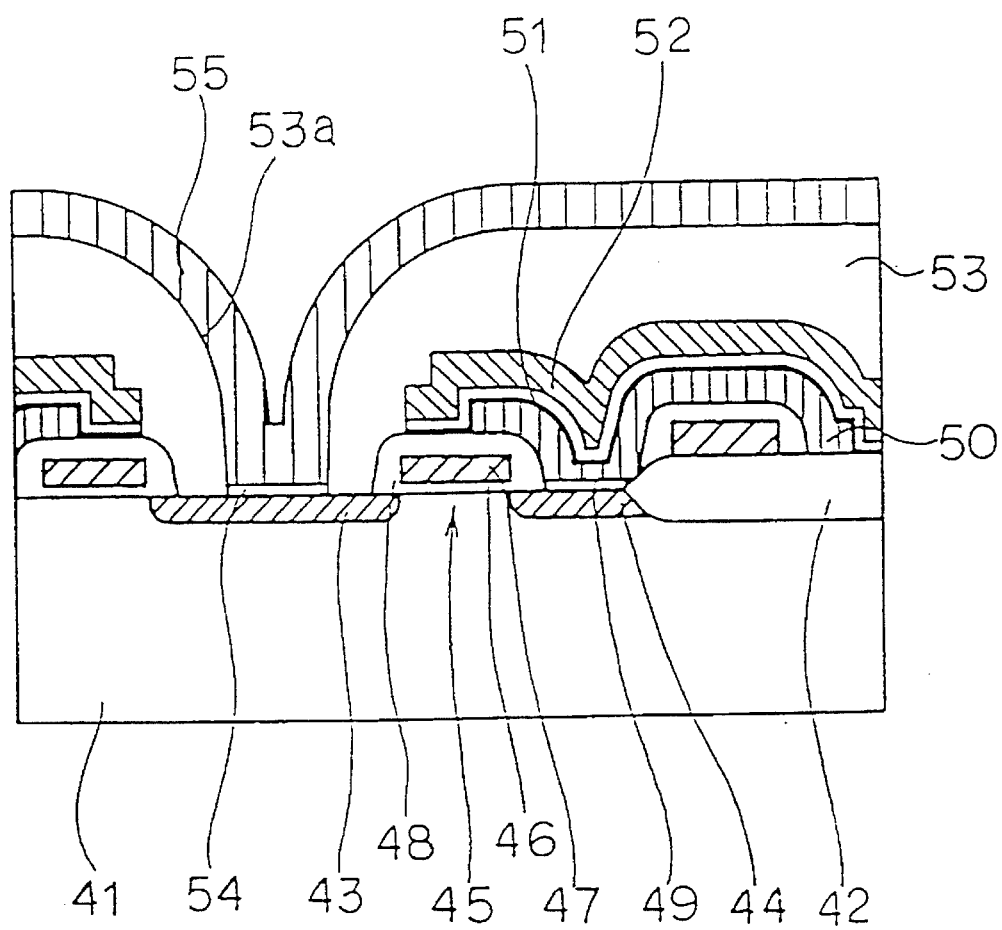
FIG. 21 is a cross-sectional view showing a structure in which the method of the second embodiment is applied to a DRAM.

With reference to FIG. 21, a DRAM employing the manufacturing method of the second embodiment includes a single-crystalline silicon substrate 41, a field oxide film 42 for elementary isolation, formed in a predetermined region on a surface of single-crystalline silicon substrate 41, a pair of n type source/drain regions 43 and 44 formed with a predetermined spacing from each other to interpose a channel region 45 therebetween in a region surrounded by field oxide film 42, a gate electrode 47 formed over channel region 45 with a gate oxide film 46 interposed therebetween, an oxide film 48 formed to cover gate electrode 47, a storage node 50 made of polycrystal silicon and formed over source/drain region 44 with a native oxide film 49 interposed therebetween, a capacitor dielectric film 51 comprised of a silicon nitride film and an oxide film and formed to cover storage node 50, a cell plate 52 made of polycrystal silicon and formed to cover capacitor dielectric film 51, an interlayer insulation film 53 formed to cover cell plate 52 and having a contract hole 53a on source/drain region 43, a thin native oxide film ($SiO_2$ film) 54 formed on a surface of source/drain region 43 in contact hole 53a, and a bit line 55 made of polycrystal silicon and formed to extend over thin native oxide film 54 and over the surface of interlayer insulation film 53. A pair of source/drain regions 43 and 44 and gate electrode 47 constitute a transfer gate transistor of a memory cell. Storage node 50, capacitor dielectric film 51 and cell plate 52 constitute a capacitor for storing charges corresponding to a data signal.

In this DRAM, the manufacturing method of the second embodiment is applied in formation of bit line 55 and storage node 50 as will be described later.

A description will now be made on a process of manufacturing such a DRAM with reference to FIGS. 21–25.

Figure 22:
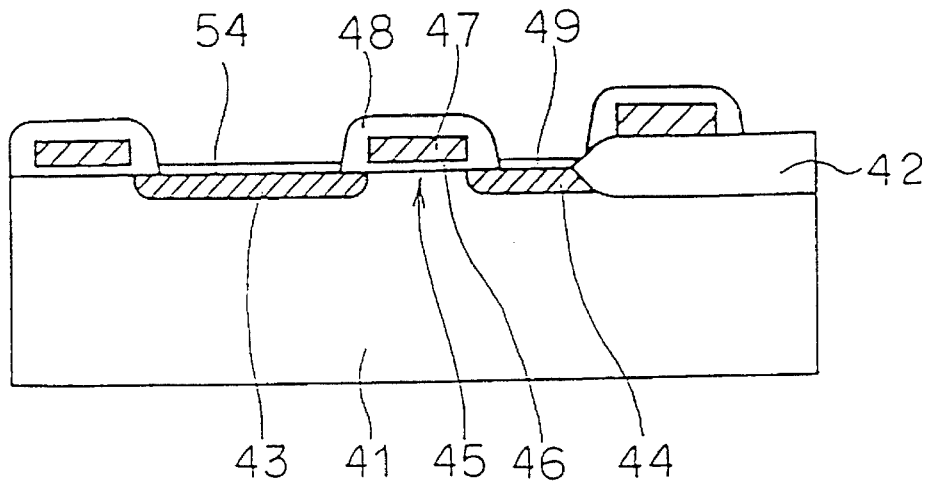
FIG. 22 is a cross-sectional view for use in explaining a first step of a manufacturing process of the DRAM shown in FIG. 21.

As shown in FIG. 22, field oxide film 42 for elementary isolation is formed in a predetermined region on a main surface of single-crystalline silicon substrate 41. Gate electrode 47 is formed on a single-crystalline silicon substrate 41 in a region surrounded by field oxide film 42, with gate oxide film 46 interposed between silicon substrate 41 and gate electrode 47. A pair of n type source/drain regions 43 and 44 are formed by ion implantation with gate electrode 47 and gate oxide film 46 used as masks. Oxide film 48 for insulation is formed to cover gate electrode 47. A native oxide film (not shown) formed on impurity regions 43 and 44 is cleaned with a solution of hydrofluoric acid (HF) and is thereby removed, as described in FIGS. 15 and 16. However, thin native oxide films 54 and 49 are formed, respectively, on the surfaces of source/drain regions 43 and 44 during rinsing after the step of cleaning with the hydrofluoric acid solution.

Figure 23:
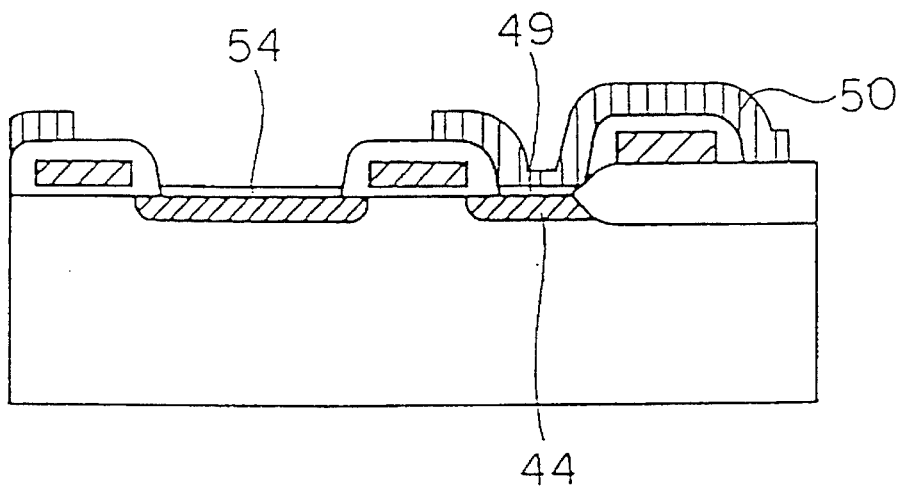
FIG. 23 is a cross-sectional view for use in explaining a second step of the manufacturing process of the DRAM shown in FIG. 21.

As shown in FIG. 23, storage node 50 made of polycrystal silicon is grown on the surface of thin native oxide film 49 on source/drain region 44 by adopting the manufacturing method of the second embodiment described with reference to FIGS. 15–20.

Figure 24:
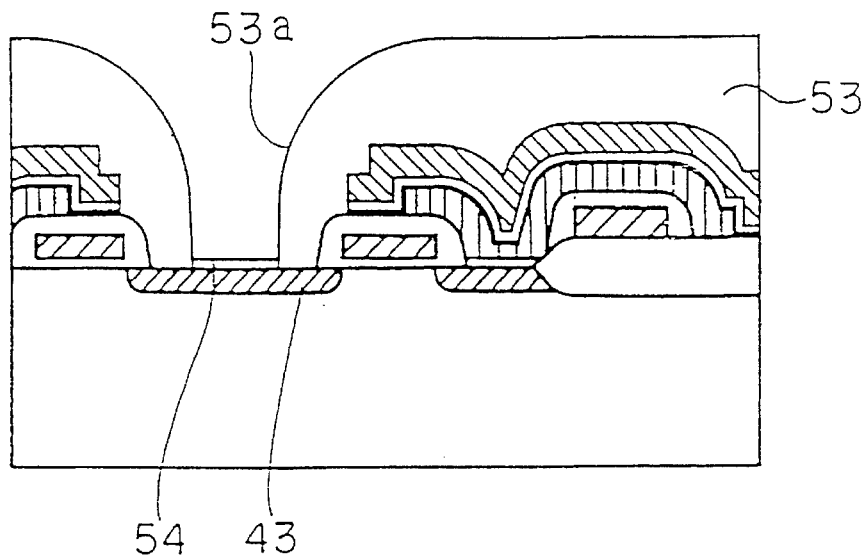
FIG. 24 is a cross-sectional view for use in explaining a third step of the manufacturing process of the DRAM shown in FIG. 21.

As shown in FIG. 24, after formation of interlayer insulation film 53 over the entire surface, contact hole 53a is formed on source/drain region 43 by employing photolithography and etching technique. The resultant film is then cleaned with a hydrofluoric acid solution (HF) in order to remove a native oxide film (not shown) formed on exposed source/drain region 43. However, thin native oxide film 54 is formed on the surface of source/drain region 43 during rinsing after the washing with the hydrofluoric acid solution.

Figure 25:
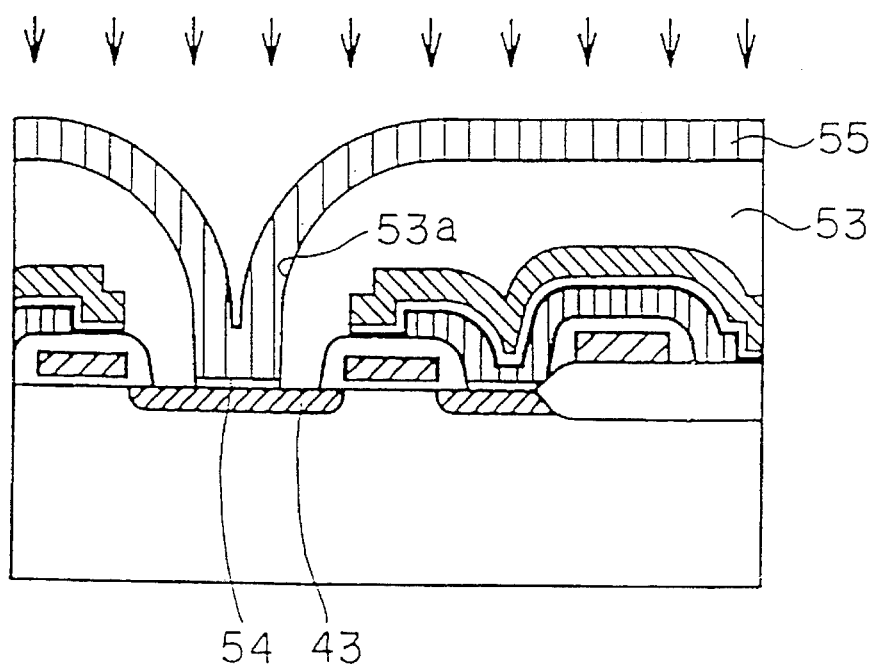
FIG. 25 is a cross-sectional view for use in explaining a fourth step of the manufacturing process of the DRAM shown in FIG. 21.

In this state, a polycrystal silicon thin film (bit line) 55 is grown on the surface of thin native oxide film 54 and on interlayer insulation film 53 as shown in FIG. 25, by employing the manufacturing method shown in FIG. 15. Arsenic (As) is then ion-implanted onto polycrystal silicon thin film (bit line) 55 by employing ion implantation.

In this DRAM, only thin native oxide films 49 and 54 of approximately 5Å are interposed, respectively, between source/drain region 44 and storage node 50 and between bit line 55 and source/drain region 43. This makes it possible to reduce a contact resistance between storage node 50 and source/drain region 44 and a contact resistance between bit line 55 and source/drain region 43 as compared to the conventional.

A description will now be made on a third embodiment of a method of manufacturing a semiconductor apparatus of the present invention with reference to FIG. 26. In the manufacturing method of the third embodiment, as a method for removing a native oxide film formed on an impurity region, a hydrofluoric acid vapor cleaning method is adopted in place of the conventional cleaning with the hydrofluoric acid solution (HF). The use of the hydrofluoric acid vapor cleaning makes it possible to completely remove the native oxide film formed on the surface of the impurity region during rinsing. As a result, it is possible to form a single-crystalline thin film directly on the surface of the impurity region at a temperature not higher than approximately 800° C.

Further in the manufacturing method of the third embodiment, a single-crystalline semiconductor substrate (not shown) is retained in a silane atmosphere under conditions of 350° C. to 540° C., whereby an amorphous silicon thin film (not shown) is formed on the semiconductor substrate. After the formation of the amorphous silicon thin film, impurities are ion-implanted onto the amorphous silicon thin film. Then, the implanted impurities are activated by a heat treatment under conditions of a temperature from 600° C. to 800° C. This heat treatment crystallizes the amorphous silicon thin film. That is, a single crystal silicon thin film is formed in a portion of the amorphous silicon thin film made contact with a single crystal semiconductor substrate (not shown), and a polycrystal silicon thin film is formed in the other portions thereof.

Figure 26:
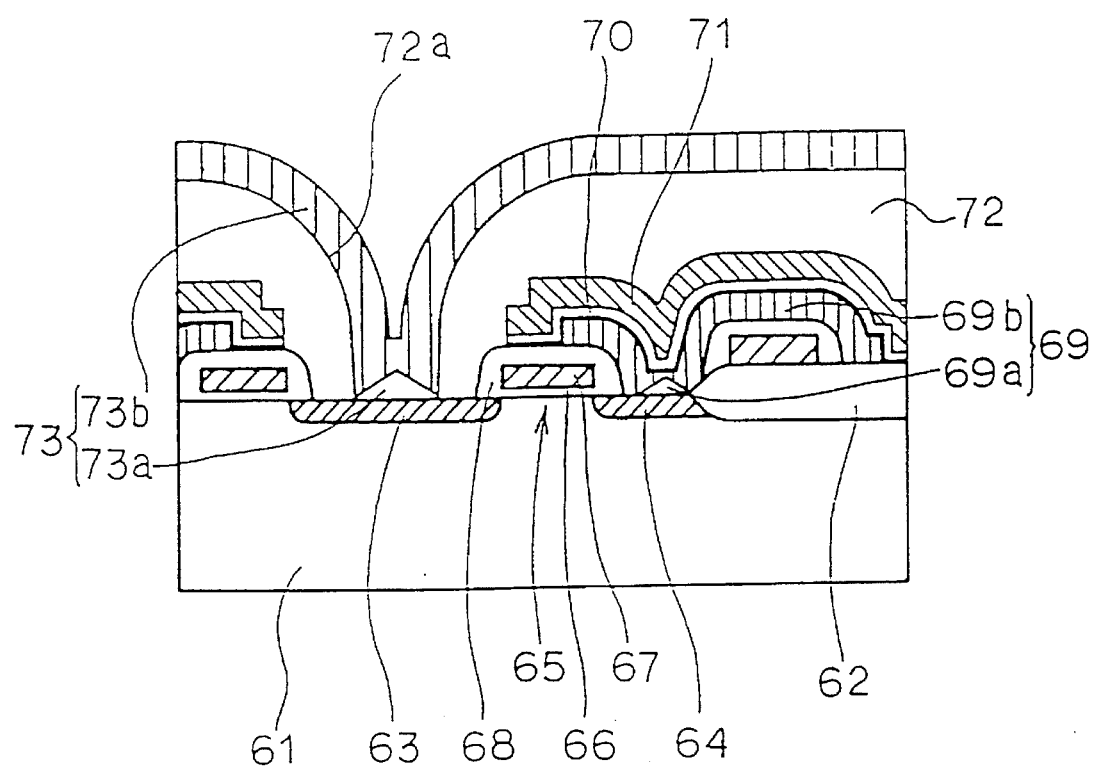
FIG. 26 is a cross-sectional view showing a structure in which a third embodiment of a method of manufacturing a semiconductor apparatus in accordance with the present invention is applied to a DRAM.

The manufacture of a DRAM by employing such a manufacturing method of the third embodiment results in a DRAM structured as shown in FIG. 26.

That is, the DRAM employing the manufacturing method of the third embodiment includes a single-crystalline silicon substrate 61, a field oxide film 62 for elementary isolation, formed in a predetermined region on a main surface of single-crystalline silicon substrate 61, a pair of n type source/drain regions 63 and 64 formed with a predetermined spacing from each other to interpose a channel region 65 therebetween in a region surrounded by field oxide film 62, a gate electrode 67 formed over channel region 65 with a gate oxide film 66 interposed therebetween, an oxide film 68 for insulation formed to cover gate electrode 67, a storage node 69 electrically connected to source/drain region 64 and comprised of a single crystal silicon thin film 69a and a polycrystal silicon thin film 69b, a capacitor dielectric film 70 formed to cover storage node 69 and comprised of a silicon nitride film and an oxide film, a cell plate 71 made of polycrystal silicon and formed to cover capacitor dielectric film 70, an interlayer insulation film 72 formed to cover cell plate 71 and having a contact hole 72a above source/drain region 63, and a bit line 73 electrically connected to source/drain region 63 in contact hole 72a and comprised of a single-crystalline silicon thin film 73a and a polycrystal silicon thin film 73b.

Source/drain regions 63 and 64 and gate electrode 67 constitute a transfer gate transistor of a memory cell. Storage node 69, capacitor dielectric film 70 and cell plate 71 constitute a capacitor for storing charges corresponding to a data signal.

A description will now be made on a process for manufacturing a DRAM to which the manufacturing method of the third embodiment is applied, with reference to FIGS. 26 and 27–30.

Figure 27:
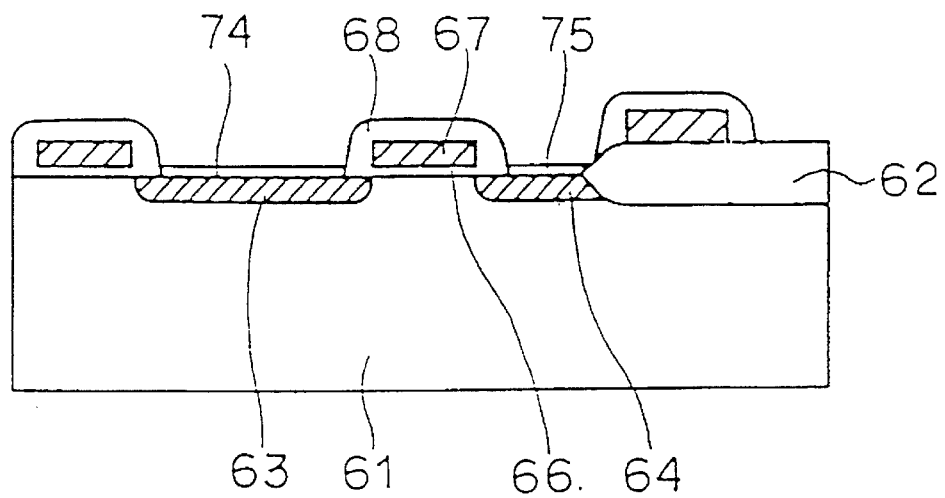
FIG. 27 is a cross-sectional view for use in explaining a first step of a manufacturing process of the DRAM shown in FIG. 26.

First, as shown in FIG. 27, field oxide film 62 for elementary isolation is formed in a predetermined region on the main surface of single-crystalline silicon substrate 61. Gate oxide film 66 and gate electrode 67 are then formed in a region surrounded by field oxide film 62. n type source/ drain regions 63 and 64 are formed by ion implantation of impurities, with gate oxide film 66 and gate electrode 67 used as masks. Oxide film 68 for insulation is formed to cover gate electrode 67. Thick native oxide films 74 and 75 are now formed, respectively on surfaces of source/drain regions 63 and 64.

Figure 28:
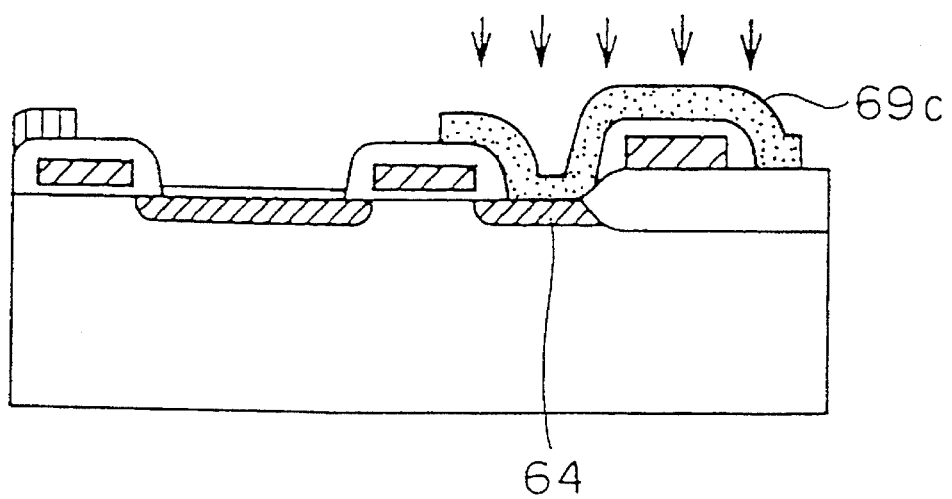
FIG. 28 is a cross-sectional view for use in explaining a second step of the manufacturing process of the DRAM shown in FIG. 26.

Thick native oxide films 74 and 75 (see FIG. 27) are then completely removed by hydrofluoric acid vapor cleaning as shown in FIG. 28. After that, an amorphous silicon thin film 69c is formed directly on the surface of source/drain region 64 at a temperature in the range of room temperature to approximately 540° C. by using the manufacturing method of the third embodiment. That is, no oxide film is formed on the surface of source/drain region 64 and amorphous silicon thin film 69c is directly formed thereon. Amorphous silicon thin film 69c is thereafter ion-implanted with arsenic (As).

Figure 29:
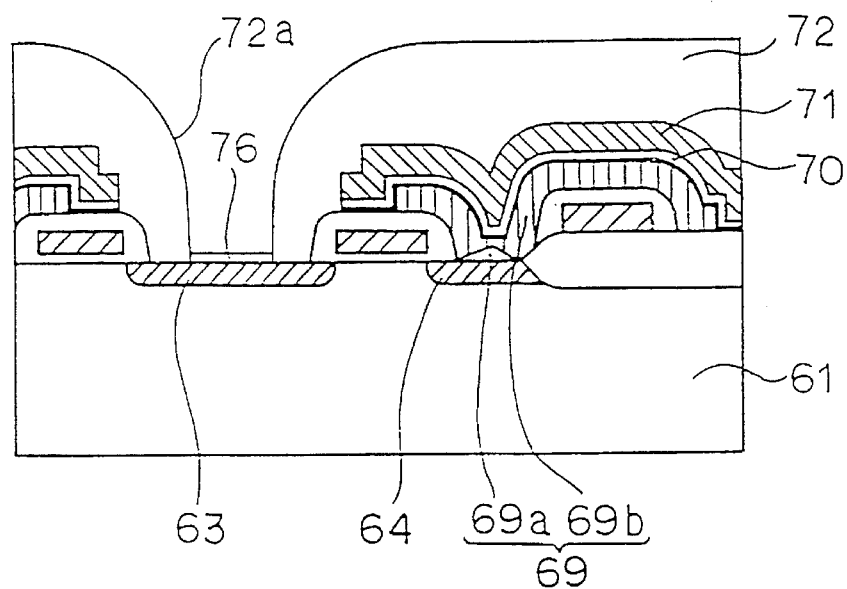
FIG. 29 is a cross-sectional view for use in explaining a third step of the manufacturing process of the DRAM shown in FIG. 26.

Then, the implanted arsenic (As) is activated by a heat treatment in the range of 600° C. to 800° C. as shown in FIG. 29. This heat treatment causes crystallization of amorphous silicon thin film 69c (see FIG. 28). Consequently, a single crystal silicon thin film 69a is formed in a portion of amorphous silicon thin film 69c (see FIG. 28) in contact with source/drain region 64, and a polycrystal silicon thin film 69b is formed in the other portions thereof. This single crystal silicon thin film 69a is formed such that its length along the main surface of silicon substrate 61 becomes smaller upward as its height becomes increased. This causes an increase by approximately 50% in a contact area of single crystal silicon thin film 69a and polycrystal silicon thin film 69b as compared to the case with a planar contact. Further, single crystal silicon thin film 69a is directly formed on the surface of source/drain region 64 without formation of any native oxide film. This enables an effective reduction in contact resistance.

After that, cell plate 71 is formed to cover storage node 69 with capacitor dielectric film 70 interposed therebetween. After interlayer insulation film 72 is formed to cover cell plate 71, contact hole 72a is formed above source/drain region 63 by employing photolithography and etching technique. A thick native oxide film 76 is now formed on the surface of source/drain region 63 exposed by the formation of contact hole 72a.

Figure 30:
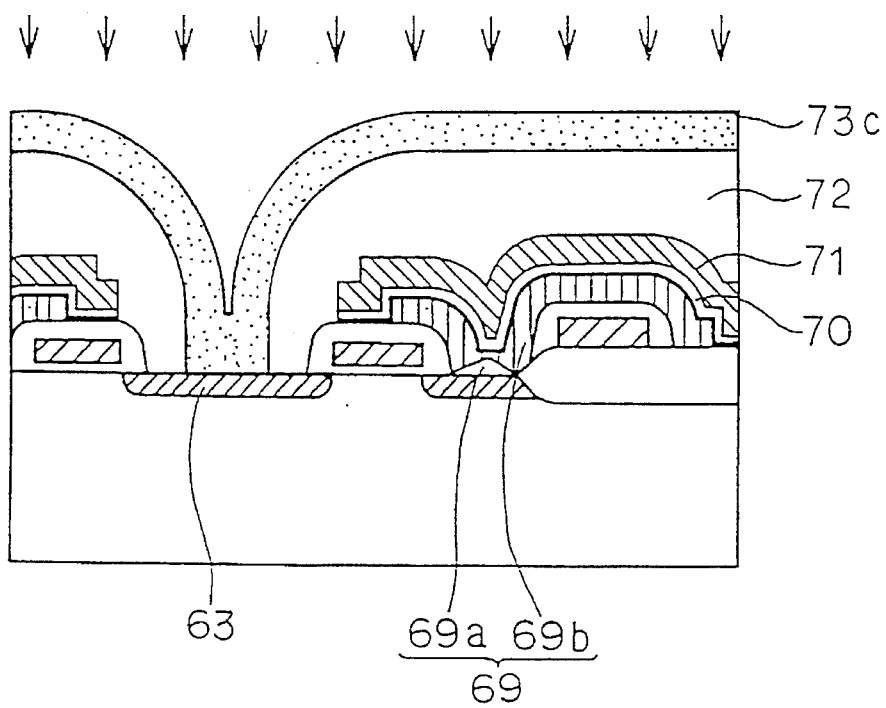
FIG. 30 is a cross-sectional view for use in explaining a fourth step of the manufacturing process of the DRAM shown in FIG. 26.
Figure 31:
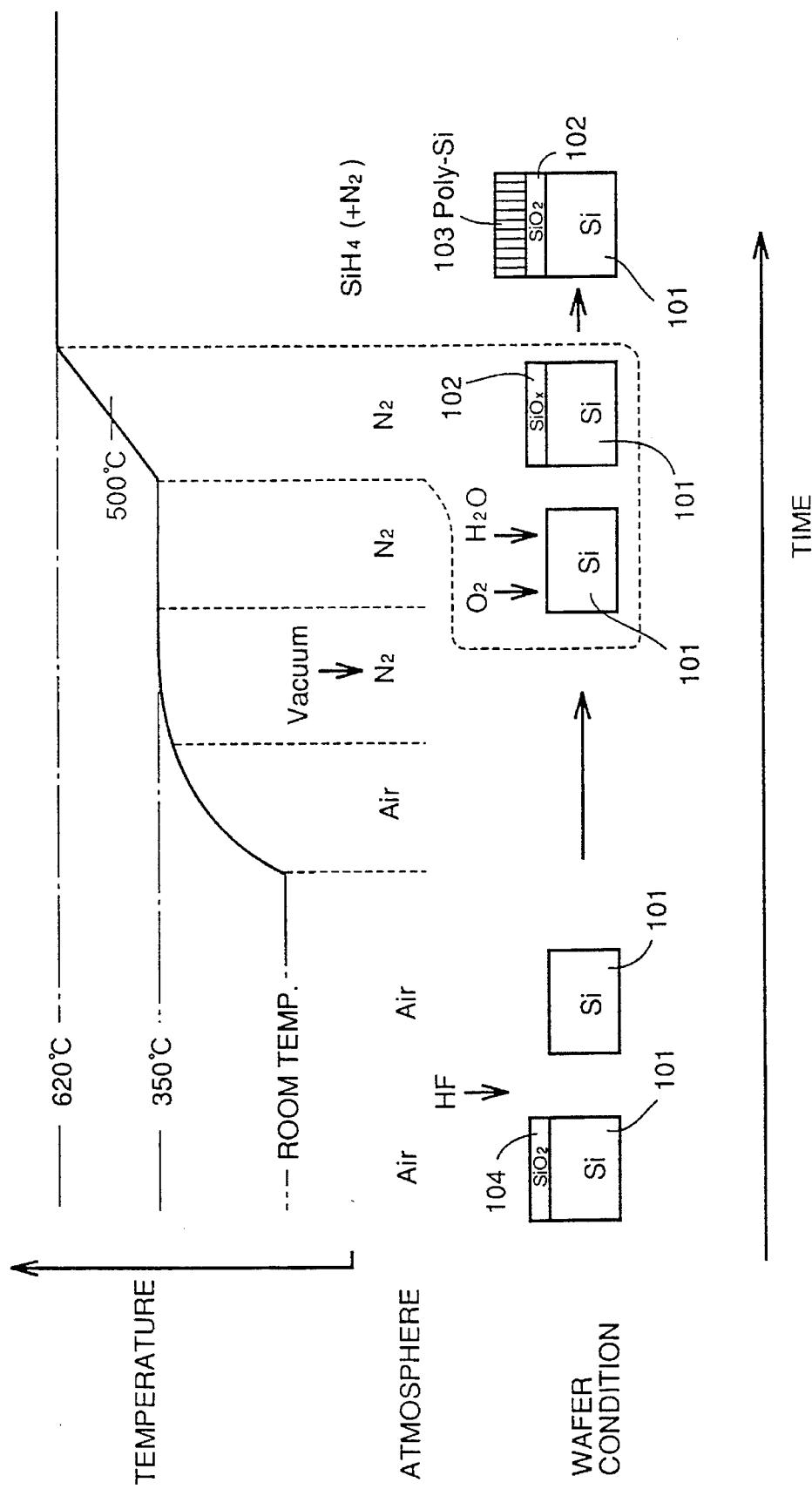
FIG. 31 is a schematic diagram for use in explaining a conventional method of manufacturing a semiconductor apparatus.
Figure 32:
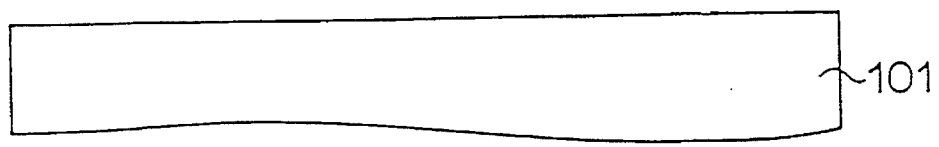
FIG. 32 is a cross-sectional view for use in explaining a first step of a manufacturing process in the conventional method shown in FIG. 31.
Figure 33:
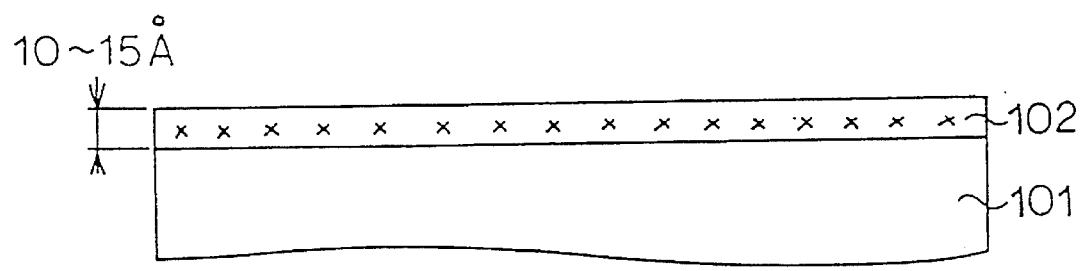
FIG. 33 is a cross-sectional view for use in explaining a second step of the manufacturing process in the conventional method shown in FIG. 31.
Figure 34:
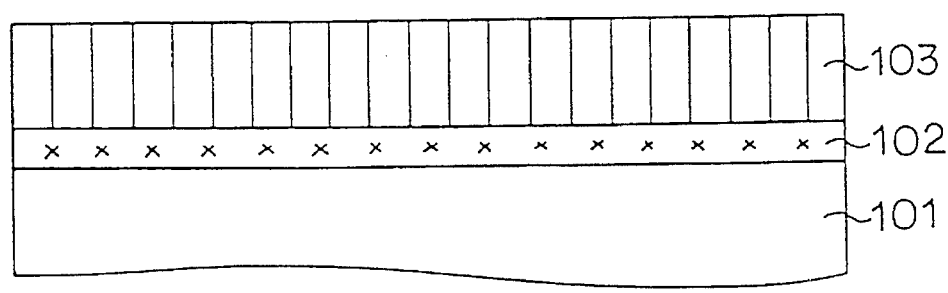
FIG. 34 is a cross-sectional view for use in explaining a third step of the manufacturing process in the conventional method shown in FIG. 31.

Thick native oxide film 76 (see FIG. 29) is then completely removed by hydrofluoric acid vapor cleaning as shown in FIG. 30. An amorphous silicon thin film 73c is subsequently grown directly on source/drain region 63 under conditions of a temperature in the range of room temperature to approximately 540° C. by use of the manufacturing method of the third embodiment. The resultant film is thereafter ion-implanted with arsenic (As) for rendering amorphous silicon thin film 73c conductive.

Finally, a heat treatment for activating the implanted As is carried out at approximately 600° C. to 800° C. as shown in FIG. 26. This heat treatment causes crystallization of amorphous silicon thin film 73c (see FIG. 30). That is, a single crystal silicon thin film 73a is formed in a portion of amorphous silicon thin film 73c (see FIG. 30) in contact with the surface of source/drain region 63, and a polycrystal silicon thin film 73b is formed in a portion contacting interlayer insulation film 72. Single crystal silicon thin film 73a is formed such that its length along the main surface of silicon substrate 61 becomes smaller upward as its height becomes increased. Accordingly, a contact area of single crystal silicon thin film 73a and polycrystal silicon thin film 73b is increased by approximately 50% as compared to the case with a planar contact. A contact resistance between silicon thin film 73b and polycrystal silicon thin film 73a is also reduced by approximately 50%.

Since polycrystal silicon thin film 73a is directly formed on the surface of source/drain region 63 without a native oxide film interposed therebetween, a contact resistance between source/drain region 63 and single crystal silicon thin film 73a can be reduced effectively.

In the semiconductor device of the present invention, since the crystallized thin film covering at least a part of the main surface of the single-crystalline semiconductor substrate is formed by growing an amorphous thin film on the single-crystalline semiconductor substrate while exposing the single-crystalline semiconductor substrate to an atmosphere including a material gas for forming the amorphous thin film, increasing the temperature of the atmosphere from the first prescribed temperature to the second prescribed temperature, single-crystallizing the amorphous thin film to form a solid phase epitaxial thin film by using the single-crystalline substrate as a seed during the increasing of the temperature of the atmosphere, and sustaining the atmosphere at the second temperature to grow a vapor phase epitaxial thin film on the solid phase epitaxial thin film to form the amorphous thin film on the single-crystalline semiconductor substrate prior to the oxidation of the surface of the single-crystalline semiconductor substrate by oxygen or steam left in the chamber, oxidation of the single-crystalline semiconductor substrate can be effectively prevented. In addition, since the temperature of the atmosphere in the chamber is increased, in line with the formation of the amorphous thin film, to crystallize the amorphous thin film during the increasing of the temperature and thereafter the temperature of the atmosphere is sustained at a prescribed temperature to form another crystallized thin film by vapor phase growth on the crystallized thin film by using the crystallized thin film, which is the crystallization of the amorphous thin film, as a seed, it is possible to form a crystallized thin film with ease on a single-crystalline semiconductor substrate. Furthermore, since a series of fabrication processes is carried out in the same chamber, they can be simplified.

In a method of fabricating a semiconductor apparatus according to one aspect of the present invention, since a substrate is retained in an atmosphere including a source material gas of a thin film and an amorphous thin film is formed on the substrate within the range of room temperature to approximately 540° C., the substrate is effectively prevented from being oxidized by oxygen or steam left in a reaction chamber in the formation of the amorphous thin film. This enables the amorphous thin film to be formed directly on the substrate. Also, when this amorphous thin film is crystallized to form a crystallized thin film, a contact resistance between the crystallized thin film and the substrate can be reduced to a larger extent than the conventional. In addition, this crystallization is carried out at a temperature not higher than approximately 800° C. and therefore does not adversely affect elements.

In a method of manufacturing a semiconductor apparatus according to another aspect of the present invention, a substrate is retained in an atmosphere including a source material gas of a thin film and an amorphous thin film is formed on the substrate, a first crystallized thin film is formed by forming the amorphous thin film and simultaneously crystallizing the amorphous thin film, and a second crystallized thin film is formed on the first crystallized thin film subsequently to the formation of the first crystallized thin film. As a result, the amorphous thin film is formed on the substrate by the source gas prior to the oxidation of the surface of the substrate by oxygen ($O_2$) or steam ($H_2O$) left in a reaction chamber. Consequently, when a single crystal substrate is used as the substrate, if the amorphous thin film formed on the substrate is single-crystallized with the substrate used as a seed, then a single-crystalline thin film can be formed directly on the substrate. When an insulator substrate is used as the substrate, since the insulator substrate is not oxidized in formation of an amorphous thin film, a contact resistance between a poly-crystalline thin film finally formed by crystallizing the amorphous thin film and a conductor layer contacting the poly-crystalline thin film through the insulator substrate can be reduced to a larger extent than the conventional.

In addition, forming the amorphous thin film, and the first and second crystallized thin films at a temperature not higher than 800° C. can effectively prevent such a disadvantage that a diffused region of a transistor extends and adversely affects elements.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, which method comprises:

placing a single-crystalline substrate in a chamber maintained at a first temperature;

introducing into the chamber an atmosphere comprising a source gas to form an amorphous thin film on the single-crystalline substrate;

increasing the temperature of the atmosphere in said chamber to a second temperature greater than the first temperature to crystallize said amorphous thin film during its formation while increasing the temperature of the atmosphere to the second temperature; and maintaining the temperature of the atmosphere in said chamber at the second temperature.

2. In a method of forming a single-crystalline epitaxial thin film on a single-crystalline substrate by exposing said substrate in a chamber to an atmosphere comprising a source gas for forming said epitaxial thin film and heating to grow said epitaxial film, the improvement comprising:

introducing the source gas to the chamber while the chamber is maintained at a first temperature to form an amorphous thin film on the substrate;

increasing the temperature in the chamber to a second temperature greater than the first temperature to crystallize the amorphous film during its formation while increasing the temperature of the atmosphere to the second temperature; and maintaining the temperature in the chamber at the second temperature to grow said epitaxial thin film.

3. A method of manufacturing a semiconductor device in which a crystallized thin film is formed on a substrate, which method comprises:

forming an amorphous thin film on said substrate at a temperature between about room temperature to approximately 540° C. while maintaining said substrate in an atmosphere comprising a source gas for forming thin film; and forming a crystallized thin film by crystallizing said amorphous thin film while said amorphous thin film is formed.

4. The method according to claim 3, wherein said substrate comprises a single-crystalline semiconductor substrate; and said crystallized thin film comprises a single-crystallized thin film.

5. A method of manufacturing semiconductor device in which a crystallized thin film is formed on a substrate, which method comprises:

forming an amorphous thin film on said substrate while maintaining said substrate in an atmosphere comprising a source gas for forming said thin film;

forming a first crystallized thin film by crystallizing said amorphous thin film while said amorphous thin film is formed; and forming a second crystallized thin film on said first crystallized thin film subsequent to the formation of said first crystallized thin film.

6. The method according to claim 5, wherein said amorphous thin film is formed at a temperature in the range of about room temperature to approximately 540° C.

7. The method according to claim 5, wherein said substrate comprises a single-crystalline semiconductor substrate;

said first crystallized thin film comprises a first single-crystallized thin film; and said second crystallized thin film comprises a second single-crystalline thin film.

8. The method according to claim 7, wherein said single crystal semiconductor substrate comprises a single crystal silicon semiconductor substrate;

said first single-crystalline thin film comprises a first single crystal silicon thin film; and said second single-crystalline thin film comprises a second single crystal silicon thin film.

9. The method according to claim 5, wherein said first crystallized thin film comprises a first poly-crystallized thin film; and said second crystallized thin film comprises a second poly-crystallized thin film.

10. The method according to claim 5, wherein the atmosphere comprises a mixture of said source gas and an inert gas.

11. The method according to claim 10, wherein said source gas is selected from the group consisting of $SiH_4$, $Si_2H_6$, and $SiH_2Cl_2$; and said inert gas is selected from the group consisting of nitrogen gas and argon gas.

12. The method according to claim 11, wherein said source gas is $SiH_4$;

said inert gas is nitrogen gas;

the flow rate of $SiH_4$ is 20 sccm;

the flow rate of nitrogen is 300 sccm; and the pressure of said atmosphere is 0.2 Torr.

13. The method according to claim 5, wherein said substrate comprises an insulator;

said first crystallized thin film comprises a first poly-crystallized thin film; and said second poly-crystallized thin film comprises a second poly-crystallized thin film.

14. The method according to claim 13, wherein said insulator substrate comprises a native oxide film.

15. The method according to claim 5, comprising:
removing an oxide film on said substrate prior to forming said amorphous thin film.

16. The method according to claim 15, comprising:
removing said oxide film with a solution of hydrofluoric acid.

17. The method according to claim 15, comprising:
removing said oxide film by hydrofluoric acid vapor cleaning.

18. A method of manufacturing a semiconductor device, which method comprises:

forming an amorphous silicon thin film on a silicon substrate at a temperature in the range of about room temperature to approximately 540° C. while maintaining said silicon substrate in an atmosphere comprising silane;

forming a first silicon crystallized film by crystallizing said amorphous silicon thin film simultaneously with forming said amorphous silicon thin film; and forming a second silicon crystallized film on said first silicon crystallized film subsequent to the formation of said first silicon crystallized film.

19. The method according to claim 18, wherein the atmosphere comprises silane gas and a nitrogen gas.

* * * * *